(12) United States Patent
Youn et al.

(10) Patent No.: US 11,737,322 B2
(45) Date of Patent: Aug. 22, 2023

(54) DISPLAY APPARATUS INCLUDING A DUMMY LIGHT-EMITTING UNIT

(71) Applicant: Samsung Display Co., Ltd., Yongin-si (KR)

(72) Inventors: Ilgoo Youn, Yongin-si (KR); Seungwoo Sung, Yongin-si (KR); Jieun Lee, Yongin-si (KR); Jintae Jeong, Yongin-si (KR); Minhee Choi, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 347 days.

(21) Appl. No.: 17/092,969

(22) Filed: Nov. 9, 2020

(65) Prior Publication Data
US 2021/0210584 A1 Jul. 8, 2021

(30) Foreign Application Priority Data

Jan. 2, 2020 (KR) .......................... 10-2020-0000490

(51) Int. Cl.
*H10K 59/131* (2023.01)
*H10K 59/88* (2023.01)
*H10K 59/122* (2023.01)

(52) U.S. Cl.
CPC ......... *H10K 59/131* (2023.02); *H10K 59/122* (2023.02); *H10K 59/88* (2023.02)

(58) Field of Classification Search
CPC ............. H01L 27/3276; H01L 27/3223; H01L 27/3246; H10K 59/131; H10K 59/122; H10K 59/88
See application file for complete search history.

(56) References Cited

U.S. PATENT DOCUMENTS

| | | |
|---|---|---|
| 9,905,629 B2 | 2/2018 | Kim et al. |
| 10,193,102 B2 | 1/2019 | Kanaya |
| 10,490,119 B2 | 11/2019 | Kim et al. |
| 2007/0178614 A1* | 8/2007 | Arasawa ................. H01L 22/32 438/17 |
| 2018/0151834 A1* | 5/2018 | Kanaya ................. H01L 51/504 |
| 2018/0342572 A1 | 11/2018 | Park et al. |
| 2019/0115415 A1 | 4/2019 | Choi et al. |

FOREIGN PATENT DOCUMENTS

| | | |
|---|---|---|
| JP | 2018-87863 A | 6/2018 |
| KR | 10-2018-0033373 A | 4/2018 |
| KR | 10-2018-0128555 A | 12/2018 |
| KR | 10-2019-0041553 A | 4/2019 |

* cited by examiner

*Primary Examiner* — Lex H Malsawma
(74) *Attorney, Agent, or Firm* — Lewis Roca Rothgerber Christie LLP

(57) ABSTRACT

A display apparatus includes a substrate; a first circuit unit located on the substrate and including a first thin-film transistor (TFT) and a first storage capacitor; a first dummy circuit unit on the substrate, including a first dummy TFT and a first dummy storage capacitor, and in the same layer as the first circuit unit; and a first dummy light-emitting unit on the first dummy circuit unit, connected to the first circuit unit, and configured to be driven by the first circuit unit, wherein the first dummy light-emitting unit overlaps the first dummy circuit unit.

22 Claims, 19 Drawing Sheets

DISPLAY APPARATUS INCLUDING A DUMMY LIGHT-EMITTING UNIT

CROSS-REFERENCE TO RELATED APPLICATION

This application claims priority to and the benefit of Korean Patent Application No. 10-2020-0000490, filed on Jan. 2, 2020, in the Korean Intellectual Property Office, the entire disclosure of which is hereby incorporated by reference.

BACKGROUND

1. Field

One or more embodiments relate to a display apparatus, and more particularly, to a display apparatus in which a light-emitting unit is moved and/or extended.

2. Description of Related Art

Display apparatuses are apparatuses for visually representing data. Display apparatuses are used as display units of small products such as mobile phones and as display units of large products such as televisions.

A display apparatus includes a substrate that is divided into a display area and a non-display area, and gate lines and data lines are formed in the display area to be insulated from each other. The gate lines and the data lines intersect or cross each other to define a plurality of pixel areas in the display area, and the plurality of pixel areas receive an electrical signal to emit light and display an image to the outside. A thin-film transistor (TFT) corresponding to each pixel area and a pixel electrode electrically connected to the TFT are provided, and an opposite electrode is commonly provided over the pixel areas. Various suitable wirings for transmitting or applying an electrical signal to the display area, a gate driver, a data driver, a controller, etc. may be provided in the non-display area.

Recently, display apparatuses have been used for various suitable purposes. Also, as thicknesses and weights of display apparatuses have decreased, the range of applications of display apparatuses has increased. As the number of users has increased, research for visually satisfying users have been actively conducted. In one such research, various attempts have been made to extend a display area of a display apparatus.

SUMMARY

Aspects of one or more embodiments are directed toward a display apparatus in which a light-emitting unit is moved and/or extended. However, the above aspects are merely an example, and thus do not limit the scope of the present disclosure.

Additional aspects will be set forth in part in the description which follows and, in part, will be apparent from the description, or may be learned by practice of the disclosed embodiments of the present disclosure.

According to one or more embodiments, a display apparatus includes a substrate; a first circuit unit located on the substrate and including a first thin-film transistor (TFT) and a first storage capacitor; a first dummy circuit unit on the substrate, including a first dummy TFT and a first dummy storage capacitor, and in the same layer as the first circuit unit; and a first dummy light-emitting unit on the first dummy circuit unit, connected to the first circuit unit, and configured to be driven by the first circuit unit, wherein the first dummy light-emitting unit overlaps the first dummy circuit unit.

The display apparatus may further include a first light-emitting unit on the first circuit unit, connected to the first circuit unit, and configured to be driven by the first circuit unit, wherein the first light-emitting unit overlaps the first circuit unit.

The display apparatus may further include a second circuit unit located on the substrate and including a second TFT and a second storage capacitor; a second dummy circuit unit on the substrate, including a second dummy TFT and a second dummy storage capacitor, and in the same layer as the second circuit unit; and a second dummy light-emitting unit on the second dummy circuit unit, connected to the second circuit unit, and configured to be driven by the second circuit unit, wherein the second dummy light-emitting unit overlaps the second dummy circuit unit.

The display apparatus may further include a second light-emitting unit on the second circuit unit, connected to the second circuit unit, and configured to be driven by the second circuit unit, wherein the second light-emitting unit overlaps the second circuit unit.

The substrate may include a transmitting area, a first display area surrounding the transmitting area, a second display area between the transmitting area and the first display area, and a first non-display area between the transmitting area and the second display area, wherein the first circuit unit is in the first display area, and wherein the first dummy circuit unit is in the second display area.

The substrate may include a third display area, a first display area surrounding the third display area, and a second display area between the first display area and the third display area, wherein a transmitting unit is in the third display area, wherein the first circuit unit is in the first display area, and wherein the first dummy circuit unit is in the second display area.

The display apparatus may further include a component located under the third display area.

According to one or more embodiments, a display apparatus includes a substrate, a first circuit unit on the substrate and including a first thin-film transistor (TFT) and a first storage capacitor, a first pixel electrode on the first circuit unit and connected to the first TFT, a pixel defining layer covering an edge of the first pixel electrode and having a first opening and a second opening through which a part of the first pixel electrode is exposed, a first intermediate layer in the first opening, a second intermediate layer in the second opening, and an opposite electrode on the pixel defining layer and covering the first intermediate layer and the second intermediate layer.

The first opening may overlap the first circuit unit.

The display apparatus may further include a second circuit unit on the substrate, in the same layer as the first circuit unit, and including a second TFT and a second storage capacitor; a second pixel electrode on the second circuit unit, in the same layer as the first pixel electrode, and connected to the second TFT; a third intermediate layer on the second pixel electrode; and a fourth intermediate layer in the same layer as the third intermediate layer, wherein the pixel defining layer covers an edge of the second pixel electrode and further has a third opening and a fourth opening through which a part of the second pixel electrode is exposed, wherein the third intermediate layer is in the third opening, and wherein the fourth intermediate layer is in the fourth opening.

The third opening may overlap the second circuit unit.

The substrate may include a transmitting area, a first display area surrounding the transmitting area, a second display area between the transmitting area and the first display area, and a first non-display area between the transmitting area and the second display area, wherein the first circuit unit is in the first display area, and wherein one of the first opening or the second opening is in the second display area.

The substrate may include a third display area, a first display area surrounding the third display area, and a second display area between the first display area and the third display area, wherein a transmitting unit is in the third display area, wherein the first circuit unit is in the first display area, and wherein one of the first opening or the second opening is in the second display area.

The display apparatus may further include a component located under the third display area.

According to one or more embodiments, a display apparatus includes a substrate including a transmitting area, a first display area surrounding the transmitting area, a second display area between the transmitting area and the first display area, and a first non-display area between the transmitting area and the second display area; a first bypass wiring in the second display area, extending in a first direction, and bypassing the transmitting area along an edge of the transmitting area; a first circuit unit in the first display area and including a first thin-film transistor (TFT) and a first storage capacitor; a first pixel electrode on the first circuit unit and connected to the first TFT; a pixel defining layer covering an edge of the first pixel electrode and having a first opening and a second opening through which a part of the first pixel electrode is exposed; a first intermediate layer in the first opening; a second intermediate layer in the second opening; and an opposite electrode on the pixel defining layer and covering the first intermediate layer and the second intermediate layer, wherein one of the first opening or the second opening overlaps the first bypass wiring.

The display apparatus may further include a second circuit unit in the first display area, in the same layer as the first circuit unit, and including a second TFT and a second storage capacitor; a second pixel electrode on the second circuit unit, in the same layer as the first pixel electrode, and connected to the second TFT; a third intermediate layer on the second pixel electrode; and a fourth intermediate layer in the same layer as the third intermediate layer, wherein the pixel defining layer covers an edge of the second pixel electrode and further has a third opening and a fourth opening through which a part of the second pixel electrode is exposed, wherein the third intermediate layer is in the third opening, the fourth intermediate layer is in the fourth opening, and one of the third opening or the fourth opening overlaps the first bypass wiring.

The first non-display area may be a third display area, wherein a transmitting unit is in the third display area.

The display apparatus may further include a component under the third display area.

The display apparatus may further include a thin-film encapsulation layer on the substrate and facing the substrate.

The first storage capacitor may include an upper electrode and a lower electrode, wherein the lower electrode overlaps the first TFT.

Other aspects and features will become apparent and more readily appreciated from the following description of the disclosed embodiments, the claims, and the accompanying drawings.

BRIEF DESCRIPTION OF THE DRAWINGS

The above and other aspects and features of embodiments of the disclosure will be more apparent from the following description taken in conjunction with the accompanying drawings, in which.

DETAILED DESCRIPTION

Figure 1:
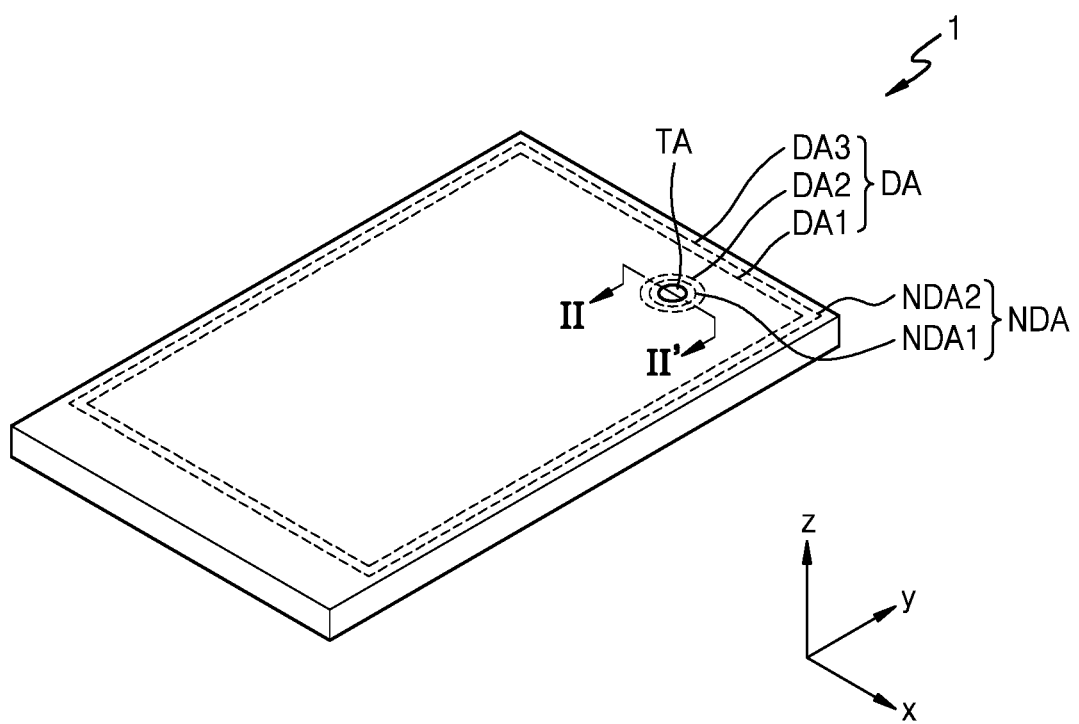
FIG. 1 is a perspective view of a display apparatus according to an embodiment of the present disclosure.

Reference will now be made in more detail to embodiments, examples of which are illustrated in the accompanying drawings, wherein like reference numerals refer to like elements throughout. In this regard, the present disclosure may have different forms and should not be construed as being limited to the embodiments disclosed herein. Accordingly, the disclosed embodiments are merely described below, by referring to the figures, to explain aspects of the present disclosure. As used herein, the use of the term "may," when describing embodiments of the present disclosure, refers to "one or more embodiments of the present disclosure." As used herein, the term "and/or" includes any and all combinations of one or more of the associated listed items. Throughout the disclosure, the expression "at least one of a, b or c" or "at least one selected from a, b, and c" indicates only a, only b, only c, both a and b, both a and c, both b and c, all of a, b, and c, or variations thereof.

Reference will now be made in more detail to embodiments, examples of which are illustrated in the accompanying drawings, and in the drawings, the same elements are denoted by the same reference numerals and a repeated explanation thereof will not be given.

It will be understood that although the terms "first," "second," etc. may be used herein to describe various elements, these elements should not be limited by these terms and these terms are only used to distinguish one element from another.

As used herein, the singular forms "a," "an," and "the" are intended to include the plural forms as well, unless the context clearly indicates otherwise.

It will be further understood that the terms "comprises" and "comprising" used herein specify the presence of stated features or components, but do not preclude the presence or addition of one or more other features or components.

It will be understood that when a layer, region, or element is referred to as being "on," another layer, region, or element, it may be directly on the other layer, region, or element, or intervening layers, regions, or elements may be present therebetween.

In the drawings, sizes of elements may be exaggerated for convenience of explanation. Because sizes and thicknesses of elements in the drawings may be exaggerated for convenience of explanation, the following embodiments are not limited thereto. As used herein, the term "substantially," "about," "approximately," and similar terms are used as terms of approximation and not as terms of degree, and are intended to account for the inherent deviations in measured or calculated values that would be recognized by those of ordinary skill in the art.

When a certain embodiment may be implemented differently, a process order may be different from the described order. For example, two consecutively described processes may be performed substantially at the same time or performed in an order opposite to the described order.

The expression "A and/or B" indicates only A, only B, or both A and B.

It will be understood that when a layer, region, or element is referred to as being "connected" to another layer, region, or element, the layer, region, or element may be directly connected to the other layer, region, or element, or may be indirectly connected to the other layer, region, or element with intervening layer(s), region(s), or element(s) therebetween. For example, when a layer, region, or element is electrically connected to another layer, region, or element, the layer, region, or element may be directly electrically connected to the other layer, region, or element, or may be indirectly electrically connected to the other layer, region, or element with intervening layers, regions, or elements therebetween.

The x-axis, the y-axis and the z-axis are not limited to three axes of the rectangular coordinate system, and may be interpreted in a broader sense. For example, the x-axis, the y-axis, and the z-axis may be perpendicular to one another, or may represent different directions that are not perpendicular to one another.

FIG. 1 is a perspective view of a display apparatus according to an embodiment of the present disclosure.

Referring to FIG. 1, a display apparatus 1 includes a display area DA that emits light and a non-display area NDA that does not emit light. The non-display area NDA and the display area DA are located adjacent to each other. The display apparatus 1 may provide an image by utilizing light emitted by a plurality of pixels arranged in the display area DA.

The display apparatus 1 includes a transmitting area TA that is at least partially surrounded by the display area DA. In an embodiment, the transmitting area TA is entirely surrounded by the display area DA in FIG. 1. The non-display area NDA may include a first non-display area NDA1 that surrounds the transmitting area TA and a second non-display area NDA2 that surrounds an outer portion of the display area DA. The first non-display area NDA1 may entirely surround the transmitting area TA, the display area DA may entirely surround the first non-display area NDA1, and the second non-display area NDA2 may entirely surround the display area DA.

The display area DA may include a second display area DA2 that surrounds the first non-display area NDA1, a first display area DA1 that entirely surrounds the second display area DA2, and a third display area DA3 that surrounds an outer portion of the first display area DA1. As described below, the first display area DA1 corresponds to a general display area, and the second display area DA2 and the third display area DA3 each correspond to a moved and/or extended display area according to an embodiment. For example, in some embodiments, the first display area DA1 may be extended by (e.g., to) the second display area DA2 and/or the third display area DA3.

Although an organic light-emitting display apparatus will be described as the display apparatus 1 according to an embodiment of the present disclosure, the display apparatus 1 of the present disclosure is not limited thereto. In another embodiment, the display apparatus 1 may be any of various suitable display apparatuses such as an inorganic electroluminescent (EL) display or a quantum dot light-emitting display.

Figure 2:
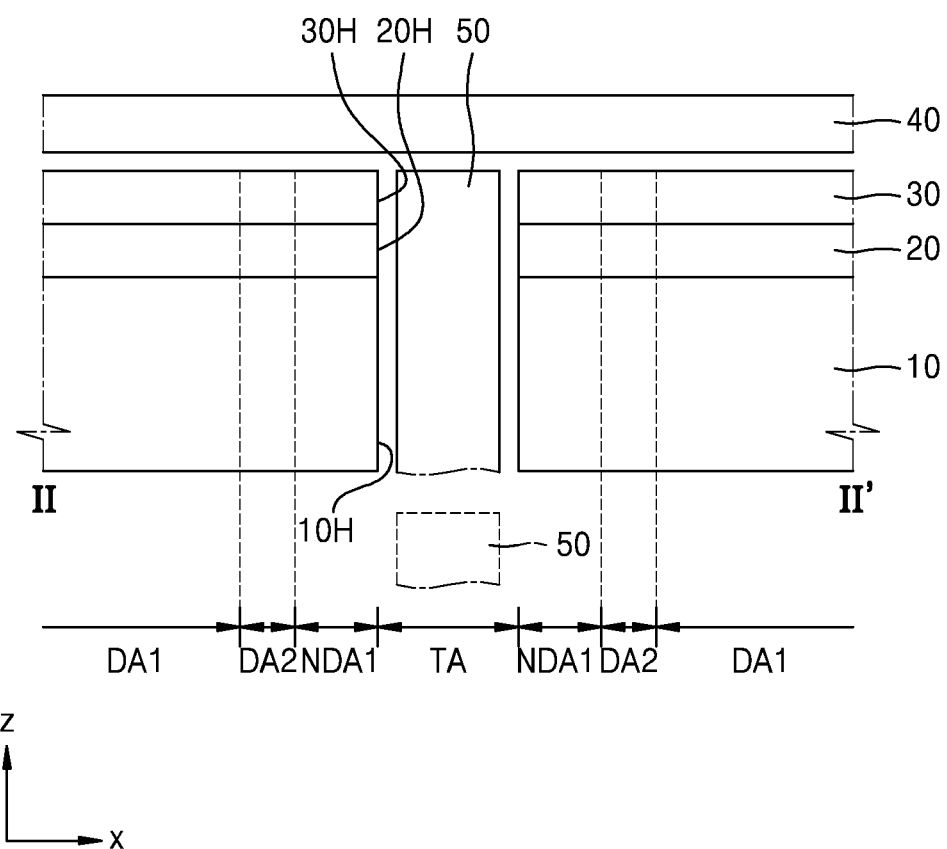
FIG. 2 is a cross-sectional view of a display apparatus according to an embodiment of the present disclosure.

FIG. 2 is a cross-sectional view of a display apparatus according to an embodiment of the present disclosure, taken along line II-II' of FIG. 1.

Referring to FIG. 2, the display apparatus 1 (see FIG. 1) may include a display panel 10, an input sensing member 20 located on the display panel 10, and an optical functional member 30, and the display panel 10, the input sensing member 20, and the optical functional member 30 may be covered by a window 40. The display apparatus 1 may be any of various suitable electronic devices such as a mobile phone, a notebook, or a smart watch.

The display panel 10 may display an image. The display panel 10 includes pixels arranged in the display area DA. Each of the pixels may include a display element and a pixel circuit connected to the display element. The display element may include an organic light-emitting diode, an inorganic light-emitting diode, or a quantum dot light-emitting diode.

The input sensing member 20 obtains coordinate information according to an external input, for example, a touch event (e.g., the touch of a user). The input sensing member 20 may include a sensing electrode (or a touch electrode) and signal lines (trace lines) connected to the sensing electrode. The input sensing member 20 may be located over the display panel 10.

The input sensing member 20 may be formed on or directly formed on the display panel 10, or may be separately formed and then may be coupled to the display panel 10 by utilizing an adhesive layer such as an optically clear adhesive (OCA). For example, the input sensing member 20 may be continuously formed after a process of forming the display panel 10 (e.g., the input sensing member 20 may be formed directly on the display panel 10 after the display panel 10 is formed), and in this case, an adhesive layer may not be located between the input sensing member 20 and the display panel 10. Although the input sensing member 20 is illustrated as located between the display panel 10 and the optical functional member 30 in FIG. 2, the input sensing member 20 may be located over the optical functional member 30 in another embodiment.

The optical functional member 30 may include an anti-reflection layer. The anti-reflection layer may reduce a reflectance of light (external light) incident from the outside through the window 40 on the display panel 10. The anti-reflection layer may include a phase retarder and a polarizer. The phase retarder may be of a film type (e.g., film-based phase retarder) or a liquid crystal coating type (e.g., liquid crystal coating-based phase retarder), and may include a $\lambda/2$ (e.g., half-wavelength) phase retarder and/or a $\lambda/4$ (e.g., quarter-wavelength) phase retarder. The polarizer may also be of a film type (e.g., film-based polarizer) or a liquid crystal coating type (e.g., liquid crystal coating-based polarizer). The polarizer of the film type (e.g., film-based) may include an elongated synthetic resin film, and the polarizer of the liquid crystal coating type (e.g., liquid crystal coating-based) may include liquid crystals arranged with a certain orientation. The phase retarder and the polarizer may further include a protective film. The phase retarder and the polarizer or the protective film may be defined as a base layer (e.g., lowermost layer) of the anti-reflection layer. For example, in some embodiments, the phase retarder and the polarizer may be defined as a base layer (e.g., lowermost layer) of the anti-reflection layer, and in some embodiments where the protective film is included, the protective film may be defined as a base layer (e.g., lowermost layer) of the anti-reflection layer.

In another embodiment, the anti-reflection layer may include a black matrix and color filters. The color filters may be arranged in consideration of (e.g., depending on) a color of light emitted by each of the pixels of the display panel 10. In another embodiment, the anti-reflection layer may include a destructive interference structure. The destructive interference structure may include a first reflective layer and a second reflective layer that are located on different layers. First reflected light and second reflected light respectively reflected by the first reflective layer and the second reflective layer may destructively interfere with each other, thereby reducing a reflectance of external light.

The optical functional member 30 may include a lens layer. The lens layer may improve light extraction efficiency of light emitted by the display panel 10 and/or may reduce color deviation. The lens layer may include a layer having a concave or convex lens shape, and/or may include a plurality of layers having different refractive indexes. The optical functional member 30 may include both the anti-reflection layer and the lens layer, or may include one of the anti-reflection layer or the lens layer.

The display panel 10, the input sensing member 20, and the optical functional member 30 may have openings. In this regard, in FIG. 2, the display panel 10, the input sensing member 20, and the optical functional member 30 respectively have first through third openings 10H, 20H, and 30H, and the first through third openings 10H, 20H, and 30H overlap one another. The first through third openings 10H, 20H, and 30H are formed to correspond to the transmitting area TA. For example, the transmitting area TA may be an area where light and/or sound output from a component 50 to the outside or traveling toward an electronic element (e.g., an electronic element included in the component 50) from the outside may be transmitted, and may be an area formed by the first through third openings 10H, 20H, and 30H.

In another embodiment, the display panel 10, the input sensing member 20, and/or the optical functional member 30 may not have an opening. For example, one or two selected from among the display panel 10, the input sensing member 20, and the optical functional member 30 may not have an opening, or all of the display panel 10, the input sensing member 20, and the optical functional member 30 may not have an opening.

The component 50 may correspond to the transmitting area TA. The component 50 may be located in the first through third openings 10H, 20H, and 30H as marked by a solid line in FIG. 2, or may be located under the display panel 10 as marked by a dashed line in FIG. 2.

The component 50 may include an electronic element. For example, the component 50 may include (e.g., be) an electronic element utilizing light and/or sound. Examples of the electronic element may include a sensor for receiving and utilizing light such as an infrared sensor, a camera for receiving light and capturing an image, a sensor for outputting and detecting light and/or sound to measure a distance or recognize a fingerprint, a small lamp for outputting light, and a speaker for outputting sound. When the component 50 includes (e.g., is) an electronic element utilizing light, the component 50 may utilize light of various suitable wavelength bands such as visible light, infrared light, or ultraviolet light.

In another embodiment, when the display apparatus 1 is utilized as a smart watch or a vehicle instrument panel, the component 50 may be a member such as a clock hand or a needle indicating certain information (e.g., a vehicle speed). When the display apparatus 1 includes a clock hand or a vehicle instrument panel, the component 50 may pass through the window 40 and may be exposed to the outside, and the window 40 may have an opening corresponding to the transmitting area TA.

The component 50 may include an element (or elements) related to a function of the display panel 10 as described above, or may include an element such as an accessory for enhancing the appearance (e.g., beauty) of the display panel 10.

Figure 3:
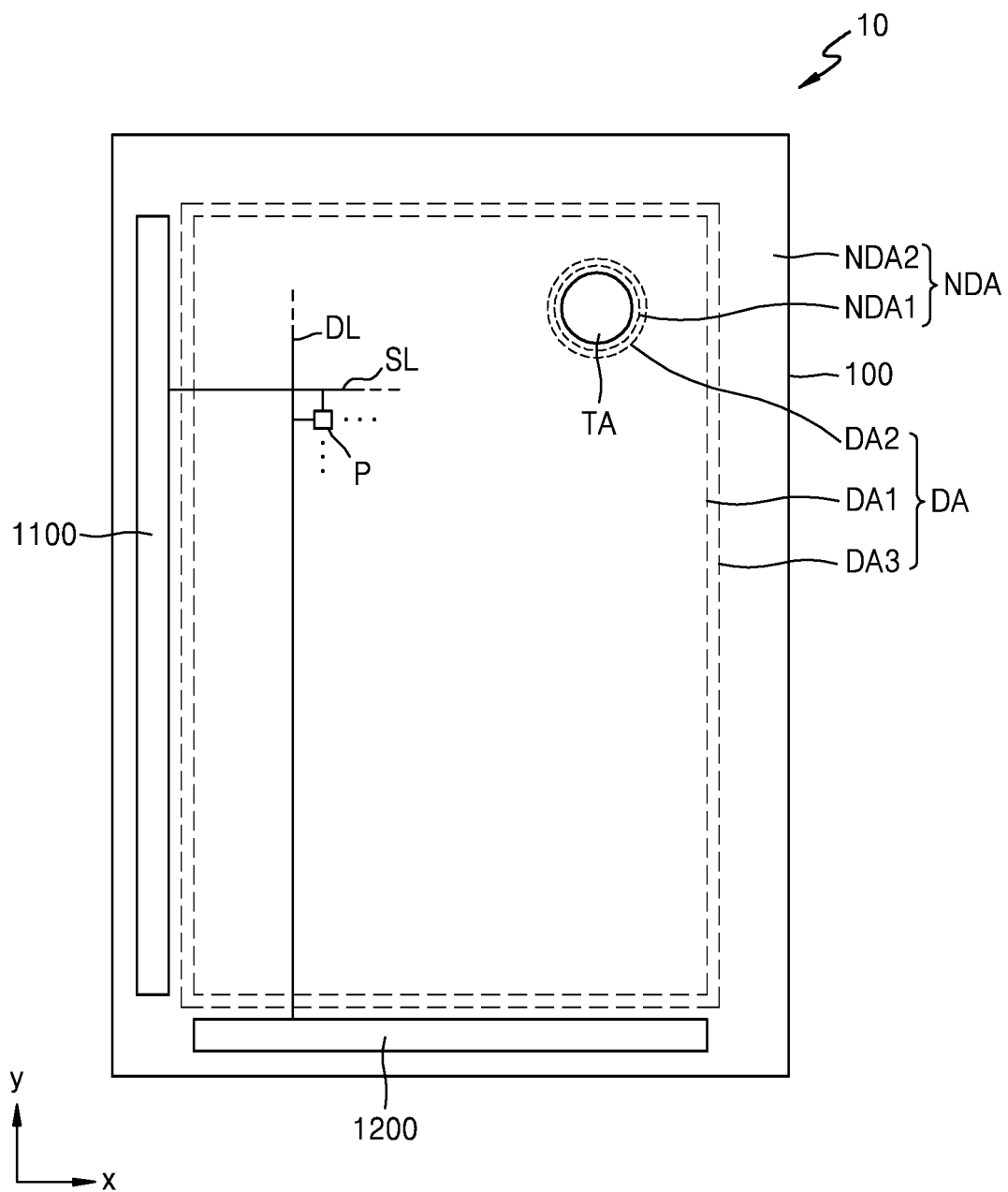
FIG. 3 is a plan view of a display panel according to an embodiment of the present disclosure.

FIG. 3 is a plan view of a display panel according to an embodiment of the present disclosure.

Referring to FIG. 3, the display panel 10 includes the display area DA and the non-display area NDA. The display area DA includes the first display area DA1, the second display area DA2, and the third display area DA3, and the non-display area NDA includes the first non-display area NDA1 and the second non-display area NDA2. FIG. 3 illustrates a substrate 100 of the display panel 10. For example, the substrate 100 may include the transmitting area TA, the display area DA, and the non-display area NDA. Also, the display panel 10 includes a plurality of pixels P arranged in the display area DA.

The first non-display area NDA1 may surround the transmitting area TA. The first non-display area NDA1 is an area where a display element such as an organic light-emitting diode to emit light is not located, and signal lines to apply signals to the pixels P are arranged around the transmitting area TA and may pass through the first non-display area NDA1. A scan driver 1100 to apply a scan signal to each pixel P, a data driver 1200 to apply a data signal to each pixel P, and main power supply wirings to apply a first power supply voltage and a second power supply voltage may be located in the second non-display area NDA2. Although the data driver 1200 is illustrated as located at a side of the substrate 100 in FIG. 3, embodiments of the present disclosure are not limited thereto. For example, in some embodiments, the data driver 1200 may be located on a flexible printed circuit board (FPCB) electrically connected to a pad located at a side of the display panel 10 according to another embodiment.

Figure 4A:
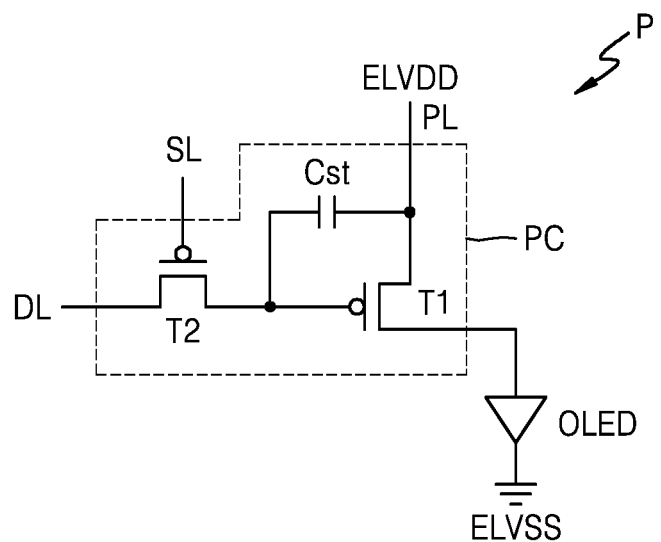
FIGS. 4A and 4B are each an equivalent circuit diagram illustrating one pixel of the display panel according to an embodiment of the present disclosure.
Figure 4B:
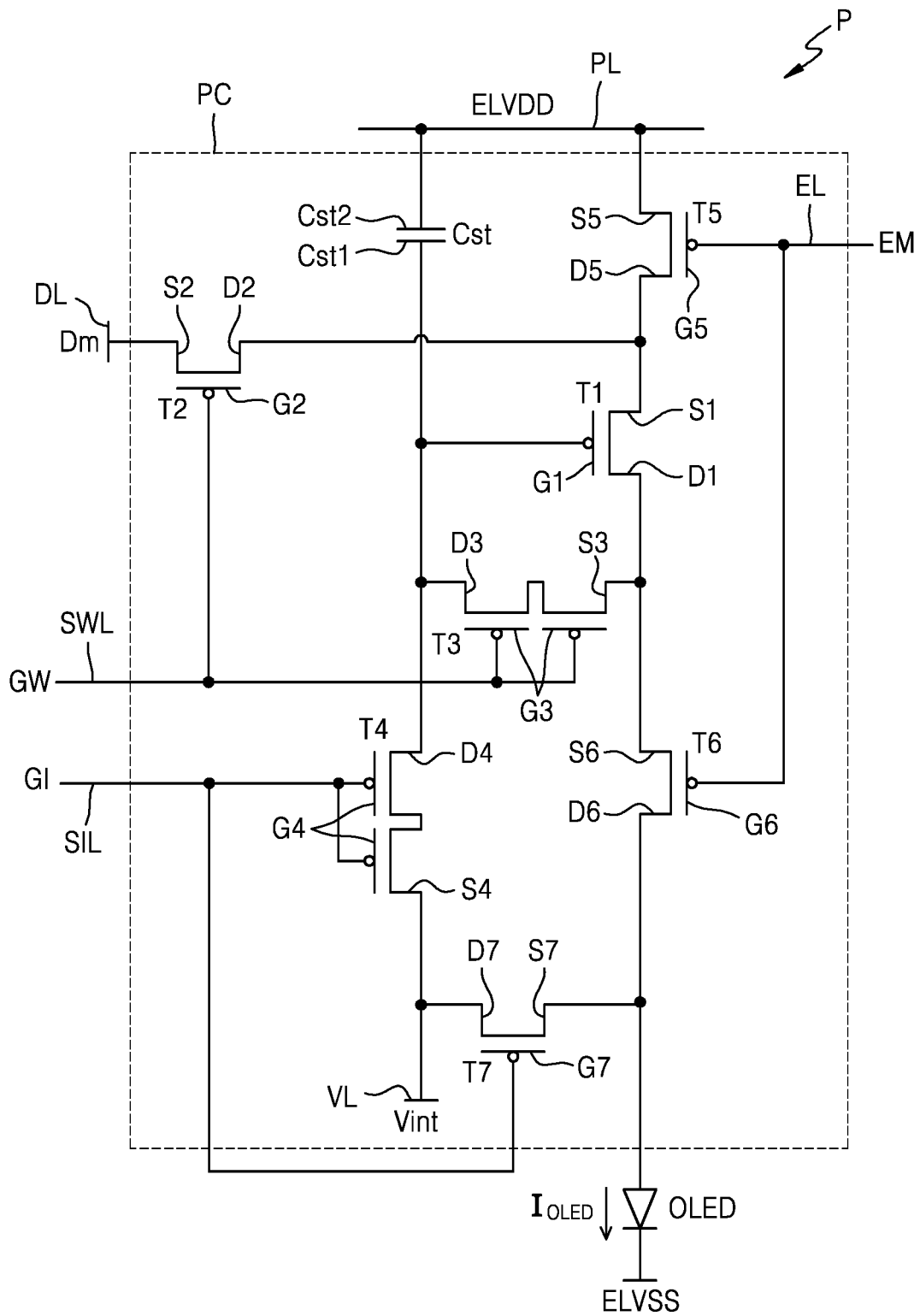

FIGS. 4A and 4B are each an equivalent circuit diagrams illustrating one pixel of a display panel according to an embodiment of the present disclosure.

Referring to FIG. 4A, each of the pixels P includes a pixel circuit PC and an organic light-emitting diode (OLED) that is a display element connected to the pixel circuit PC. The pixel circuit PC may include a driving thin-film transistor (TFT) T1, a switching TFT T2, and a storage capacitor Cst. Each pixel P may emit, for example, red, green, blue, or white light, through the OLED.

The switching TFT T2 may be connected to a scan line SL and a data line DL, and may transmit a data voltage input from the data line DL to the driving TFT T1 according to a switching voltage input from the scan line SL. The storage capacitor Cst may be connected to the switching TFT T2 and a driving voltage line PL, and may store a voltage corresponding to a difference between a voltage received from the switching TFT T2 and a first power supply voltage ELVDD supplied to the driving voltage line PL.

The driving TFT T1 may be connected to the driving voltage line PL and the storage capacitor Cst, and may control driving current flowing from the driving voltage line PL to the OLED in response to the voltage stored in the storage capacitor Cst. The OLED may emit light having a luminance due to (e.g., corresponding to) the driving current. An opposite electrode (e.g., a cathode) of the OLED may receive a second power supply voltage ELVSS.

Although the pixel circuit PC is illustrated to include two TFTs and one storage capacitor in FIG. 4A, the present disclosure is not limited thereto. The number of TFTs and the number of storage capacitors may be changed in various suitable ways according to a design of the pixel circuit PC. FIG. 4B will be described assuming that the pixel circuit PC includes seven TFTs and one storage capacitor.

Referring to FIG. 4B, each pixel P may include the pixel circuit PC and the OLED connected to the pixel circuit PC, and the pixel circuit PC may include a plurality of TFTs and the storage capacitor Cst. The TFTs and the storage capacitor Cst may be connected to signal lines (e.g., a scan line SWL, a previous scan line SIL, an emission control line EL, and the data line DL), an initialization voltage line VL, and the driving voltage line PL.

Although each pixel P is illustrated to be connected to the signal lines (e.g., SWL, SIL, EL, and DL), the initialization voltage line VL, and the driving voltage line PL in FIG. 4B, the present disclosure is not limited thereto. In another embodiment, at least one of the signal lines (e.g., SWL, SIL, EL, and DL), the initialization voltage line VL, or the driving voltage line PL may be shared by neighboring pixels.

The plurality of TFTs may include the driving TFT T1, the switching TFT T2, a compensation TFT T3, a first initialization TFT T4, an operation control TFT T5, an emission control TFT T6, a second initialization TFT T7.

The signal lines include the scan line SWL that transmits a scan signal GW, the previous scan line SIL that transmits a previous scan signal GI to the first initialization TFT T4 and the second initialization TFT T7, the emission control line EL that transmits an emission control signal EM to the operation control TFT T5 and the emission control TFT T6, and the data line DL that intersects or cross the scan line SWL and transmits a data signal Dm. The driving voltage line PL transmits a driving voltage ELVDD to the driving TFT T1, and the initialization voltage line VL transmits an initialization voltage Vint to initialize the driving TFT T1 and a pixel electrode (e.g., a pixel electrode of the OLED).

A driving gate electrode G1 of the driving TFT T1 is connected to a first storage capacitor plate Cst1 of the storage capacitor Cst, a driving source electrode S1 of the driving TFT T1 is connected to (e.g., passes through) the operation control TFT T5 and is connected to the driving voltage line PL (e.g., through the operation control TFT T5), and a driving drain electrode D1 of the driving TFT T1 is connected to (e.g., passes through) the emission control TFT T6 and is electrically connected to the pixel electrode of the OLED (e.g., through the emission control TFT T6). The driving TFT T1 receives the data signal Dm according to a switching operation of the switching TFT T2 and supplies driving current IDLED to the OLED.

A switching gate electrode G2 of the switching TFT T2 is connected to the scan line SWL; a switching source electrode S2 of the switching TFT T2 is connected to the data line DL; and a switching drain electrode D2 of the switching TFT T2 is connected to the driving source electrode S1 of the driving TFT T1, is connected to (e.g., passes through) the operation control TFT T5, and is connected to the driving voltage line PL (e.g., through the operation control TFT T5). The switching TFT T2 is turned on according to the scan signal GW received through the scan line SWL and performs a switching operation of transmitting the data signal Dm received through the data line DL to the driving source electrode S1 of the driving TFT T1.

A compensation gate electrode G3 of the compensation TFT T3 is connected to the scan line SWL; a compensation source electrode S3 of the compensation TFT T3 is connected to the driving drain electrode D1 of the driving TFT T1, is connected to (e.g., passes through) the emission control TFT T6, and is connected to the pixel electrode of the OLED (e.g., through the emission control TFT T6); and a compensation drain electrode D3 of the compensation TFT T3 is connected to the first storage capacitor plate Cst1 of the storage capacitor Cst, a first initialization drain electrode D4 of the first initialization TFT T4, and the driving gate electrode G1 of the driving TFT T1. The compensation TFT T3 is turned on according to the scan signal GW received through the scan line SWL, and diode-connects the driving TFT T1 by electrically connecting the driving gate electrode G1 and the driving drain electrode D1 of the driving TFT T1. In some embodiments, the compensation TFT T3 may have a dual TFT structure or a dual gate structure.

A first initialization gate electrode G4 of the first initialization TFT T4 is connected to the previous scan line SIL; a first initialization source electrode S4 of the first initialization TFT T4 is connected to a second initialization drain electrode D7 of the second initialization TFT T7 and the initialization voltage line VL; and the first initialization drain electrode D4 of the first initialization TFT T4 is connected to the first storage capacitor plate Cst1 of the storage capacitor Cst, the compensation drain electrode D3 of the compensation TFT T3, and the driving gate electrode G1 of the driving TFT T1. The first initialization TFT T4 is turned on according to the previous scan signal GI received through the previous scan line SIL and performs an initialization operation of initializing a voltage of the driving gate electrode G1 of the driving TFT T1 by transmitting the initialization voltage Vint to the driving gate electrode G1 of the driving TFT T1. In some embodiments, the first initialization TFT T4 may have a dual TFT structure or a dual gate structure.

An operation control gate electrode G5 of the operation control TFT T5 is connected to the emission control line EL, an operation control source electrode S5 of the operation control TFT T5 is connected to the driving voltage line PL, and an operation control drain electrode D5 of the operation control TFT T5 is connected to the driving source electrode S1 of the driving TFT T1 and the switching drain electrode D2 of the switching TFT T2.

An emission control gate electrode G6 of the emission control TFT T6 is connected to the emission control line EL, an emission control source electrode S6 of the emission control TFT T6 is connected to the driving drain electrode D1 of the driving TFT T1 and the compensation source electrode S3 of the compensation TFT T3, and an emission control drain electrode D6 of the emission control TFT T6 is electrically connected to a second initialization source electrode S7 of the second initialization TFT T7 and the pixel electrode of the OLED.

The operation control TFT T5 and the emission control TFT T6 are concurrently or simultaneously turned on according to the emission control signal EM received through the emission control line EL, so that the driving voltage ELVDD is transmitted to the OLED and the driving current IDLED flows through the OLED.

A second initialization gate electrode G7 of the second initialization TFT T7 is connected to the previous scan line SIL, the second initialization source electrode S7 of the second initialization TFT T7 is connected to the emission control drain electrode D6 of the emission control TFT T6 and the pixel electrode of the OLED, and the second initialization drain electrode D7 of the second initialization TFT T7 is connected to the first initialization source electrode S4 of the first initialization TFT T4 and the initialization voltage line VL. The second initialization TFT T7 is turned on according to the previous scan signal GI received through the previous scan line SIL and initializes the pixel electrode of the OLED.

Although the first initialization TFT T4 and the second initialization TFT T7 are illustrated as connected to the previous scan line SIL in FIG. 4B, the present disclosure is not limited thereto. In another embodiment, the first initialization TFT T4 may be connected to the previous scan line SIL and may be driven according to the previous scan signal GI, and the second initialization TFT T7 may be connected to an additional signal line (e.g., a next scan line) and may be driven according to a signal transmitted to the additional signal line.

A second storage capacitor plate Cst2 of the storage capacitor Cst is connected to the driving voltage line PL, and an opposite electrode (e.g., a cathode) of the OLED is connected to a common voltage ELVSS. Accordingly, the OLED may receive the driving current IDLED from the driving TFT T1 and may emit light to display an image.

Although the compensation TFT T3 and the first initialization TFT T4 are illustrated to have a dual gate electrode structure in FIG. 4B, the present disclosure is not limited thereto, and the compensation TFT T3 and the first initialization TFT T4 may have one gate electrode.

Although the pixel circuit PC is illustrated to include seven TFTs and one storage capacitor in FIG. 4B, the present disclosure is not limited thereto and various suitable modifications may be made. For example, the number of TFTs may be equal to or less than 6 or equal to or greater than 8, and the number of storage capacitors may be equal to or greater than 2 or no storage capacitors may be included, according to a design of the pixel circuit PC.

Figure 5:
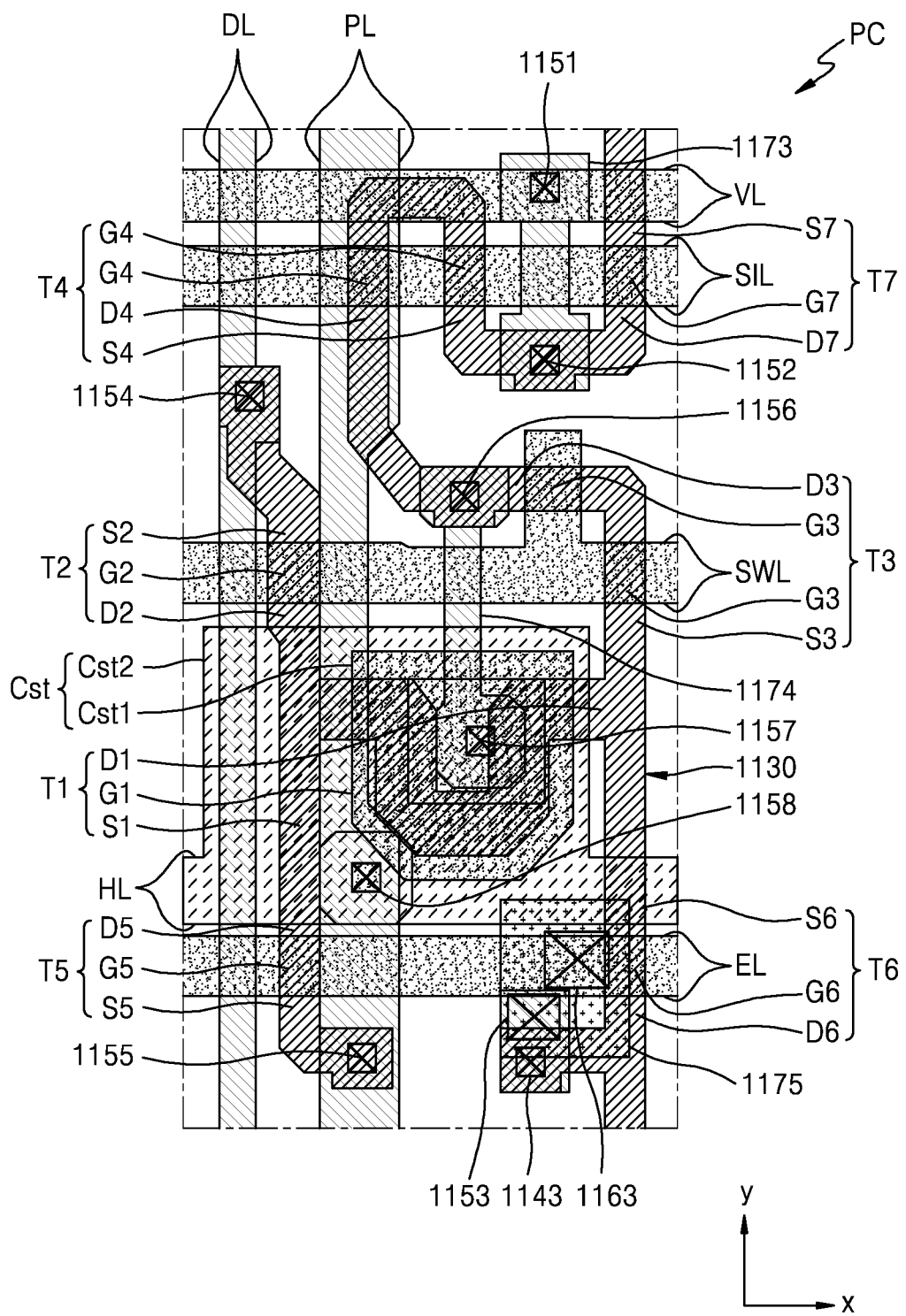
FIG. 5 is a plan view illustrating one pixel of a display panel according to an embodiment of the present disclosure.

FIG. 5 is a plan view illustrating one pixel circuit of a display panel according to an embodiment of the present disclosure.

Referring to FIG. 5, the driving TFT T1, the switching TFT T2, the compensation TFT T3, the first initialization TFT T4, the operation control TFT T5, the emission control TFT T6, and the second initialization TFT T7 are arranged along a semiconductor layer 1130. The semiconductor layer 1130 may be located on the substrate 100, and a buffer layer 110 (see FIG. 7A) including (e.g., being) an inorganic material such as silicon oxide, silicon nitride, and/or silicon oxynitride may be located under the semiconductor layer 1130.

Some portions of the semiconductor layer 1130 correspond to semiconductor layers of the driving TFT T1, the switching TFT T2, the compensation TFT T3, the first initialization TFT T4, the operation control TFT T5, the emission control TFT T6, and the second initialization TFT T7. For example, the semiconductor layers of the driving TFT T1, the switching TFT T2, the compensation TFT T3, the first initialization TFT T4, the operation control TFT T5, the emission control TFT T6, and the second initialization TFT T7 may be connected to one another and may be curved in various suitable shapes.

The semiconductor layer 1130 may include a channel region (e.g., a plurality of channel regions), and a source region (e.g., a plurality of source regions) and a drain region (e.g., a plurality of drain regions) located at both sides of the channel region, and the source region and the drain region may be understood as (e.g., may be referred to as) a source electrode and a drain electrode, respectively, of a corresponding TFT. For convenience, the source region and the drain region are respectively referred to as a source electrode and a drain electrode.

The driving TFT T1 includes the driving gate electrode G1 overlapping a driving channel region, and the driving source electrode S1 and the driving drain electrode D1 located at both sides of the driving channel region. The driving channel region overlapping the driving gate electrode G1 may have a bent shape such as an omega (e.g., Ω) shape to form a long channel in a narrow space. When the driving channel region is long, a driving range of a gate voltage may be increased, a gray scale of light emitted by the OLED (see FIG. 4A) may be more finely controlled, and display quality may be improved.

The switching TFT T2 includes the switching gate electrode G2 overlapping a switching channel region, and the switching source electrode S2 and the switching drain electrode D2 located at both sides of the switching channel region. The switching drain electrode D2 may be connected to the driving source electrode S1.

The compensation TFT T3 having a dual TFT structure (or a dual gate structure) may include the compensation gate electrodes G3 overlapping two compensation channel regions, and the compensation source electrode S3 and the compensation drain electrode D3 located at both sides of the compensation gate electrodes G3. The compensation TFT T3 may be connected to the driving gate electrode G1 of the driving TFT T1 through a node connection line 1174 as described below.

The first initialization TFT T4 having a dual TFT structure (or a dual gate structure) may include the first initialization gate electrodes G4 overlapping two first initialization channel regions, and the first initialization source electrode S4 and the first initialization drain electrode D4 located at both sides of the first initialization gate electrodes G4.

The operation control TFT T5 may include the operation control gate electrode G5 overlapping an operation control channel region, and the operation control source electrode S5 and the operation control drain electrode D5 located at both sides of the operation control gate electrode G5. The operation control drain electrode D5 may be connected to the driving source electrode S1.

The emission control TFT T6 may include the emission control gate electrode G6 overlapping an emission control channel region, and the emission control source electrode S6 and the emission control drain electrode D6 located at both sides of the emission control gate electrode G6. The emission control source electrode S6 may be connected to the driving drain electrode D1.

The second initialization TFT T7 may include the second initialization gate electrode G7 overlapping a second initialization channel region, and the second initialization source electrode S7 and the second initialization drain electrode D7 located at both sides of the second initialization gate electrode G7.

The above TFTs may be connected to the signal lines (e.g., SWL, SIL, EL, and DL), the initialization voltage line VL, and the driving voltage line PL.

A first gate insulating layer 111 (see FIG. 7A) may be located on the semiconductor layer 1130, and the scan line SWL, the previous scan line SIL, the emission control line EL, the driving gate electrode G1, and the initialization voltage line VL may be located on the first gate insulating layer 111. The first gate insulating layer 111 may include (e.g., be) an inorganic material such as silicon oxide, silicon nitride, and/or silicon oxynitride. Each of the scan line SWL, the previous scan line SIL, the emission control line EL, the driving gate electrode G1, and the initialization voltage line VL may include (e.g., be) a metal such as molybdenum (Mo), aluminum (Al), copper (Cu), titanium (Ti), or an alloy thereof.

The scan line SWL may extend in an x-direction. Some portions of the scan line SWL may correspond to the switching and compensation gate electrodes G2 and G3. For example, portions of the scan line SWL overlapping channel regions of the switching and compensation TFTs T2 and T3 may be respectively the switching and compensation gate electrodes G2 and G3.

The previous scan line SIL may extend in the x-direction, and some portions of the previous scan line SIL may correspond to the first and second initialization gate electrodes G4 and G7. For example, portions of the previous scan line SIL overlapping channel regions of the first and second initialization TFTs T4 and T7 may be respectively the first and second initialization gate electrodes G4 and G7.

The emission control line EL extends in the x-direction. Some portions of the emission control line EL may correspond to the operation control and emission control gate electrodes G5 and G6. For example, portions of the emission control line EL overlapping channel regions of the operation control and emission control TFTs T5 and T6 may be respectively the operation control and emission control gate electrodes G5 and G6.

The driving gate electrode G1 that is a floating electrode may be connected to the compensation TFT T3 through the node connection line 1174.

The initialization voltage line VL extends in the x-direction. The initialization voltage line VL may be connected to the first and second initialization TFTs T4 and T7 through an initialization connection line 1173.

Although the initialization voltage line VL is described as located on the first gate insulating layer 111 in FIG. 5, the present disclosure is not limited thereto. In some embodiments, the initialization voltage line VL may be located on a planarization layer 117 (see FIG. 7A) and may include (e.g., be) the same material as that of a first pixel electrode 310 (see FIG. 6) in another embodiment.

An electrode voltage line HL may be located on (e.g., on a higher layer than) the scan line SWL, the previous scan line SIL, the emission control line EL, the driving gate electrode G1, and the initialization voltage line VL with a second gate insulating layer 113 (see FIG. 7A) including (e.g., being) an inorganic material therebetween.

A part of the electrode voltage line HL may cover at least a part of the driving gate electrode G1, and may form the storage capacitor Cst along with the driving gate electrode G1. For example, the driving gate electrode G1 may be the first storage capacitor plate Cst1 of the storage capacitor Cst, and a part of the electrode voltage line HL may be the second storage capacitor plate Cst2 of the storage capacitor Cst.

The electrode voltage line HL and the second storage capacitor plate Cst2 are electrically connected to the driving voltage line PL. In this regard, in FIG. 5, the electrode voltage line HL is connected through a contact hole 1158 to the driving voltage line PL located on the electrode voltage line HL. The electrode voltage line HL and the driving voltage line PL may have the same voltage level (e.g., a constant voltage of +5 V). The electrode voltage line HL may be a horizontal driving voltage line.

Because the driving voltage line PL extends in a y-direction and the electrode voltage line HL electrically connected to the driving voltage line PL extends in the x-direction intersecting or crossing the y-direction, a plurality of driving voltage lines PL and electrode voltage lines HL may be arranged in a mesh structure in a display area.

The data line DL, the driving voltage line PL, the initialization connection line 1173, and the node connection line 1174 may be located on the second storage capacitor plate Cst2 and the electrode voltage line HL with a first interlayer insulating layer 115 including (e.g., being) an inorganic material (see FIG. 7A) therebetween. Each of the data line DL, the driving voltage line PL, the initialization connection line 1173, and the node connection line 1174 may include (e.g., be) aluminum (Al), copper (Cu), and/or titanium (Ti), and may have a single layer or multi-layer structure. In an embodiment, each of the driving voltage line PL and the data line DL may have a multi-layer structure including (e.g., being) Ti/Al/Ti.

The data line DL may extend in the y-direction, and may be connected to the switching source electrode S2 of the switching TFT T2 through a contact hole 1154. A part of the data line DL may be understood as (e.g., may be referred to as) a switching source electrode.

The driving voltage line PL extends in the y-direction, and is connected to the electrode voltage line HL through the contact hole 1158 as described above. Also, the driving voltage line PL may be connected to the operation control TFT T5 through a contact hole 1155. The driving voltage line PL may be connected to the operation control source electrode S5 through the contact hole 1155.

An end of the initialization connection line 1173 may be connected to the first and second initialization TFTs T4 and T7 through a contact hole 1152, and the other end of the initialization connection line 1173 may be connected to the initialization voltage line VL through a contact hole 1151.

An end of the node connection line 1174 may be connected to the compensation drain electrode D3 through a contact hole 1156, and the other end of the node connection line 1174 may be connected to the driving gate electrode G1 through a contact hole 1157.

The first pixel electrode 310 may be connected to a connection metal 1175 through a contact hole 1163, and the connection metal 1175 may be connected to the emission control drain electrode D6 through a contact hole 1153 passing through a second interlayer insulating layer 116 (see FIG. 7A) and a contact hole 1143 passing through the first interlayer insulating layer 115.

Figure 6:
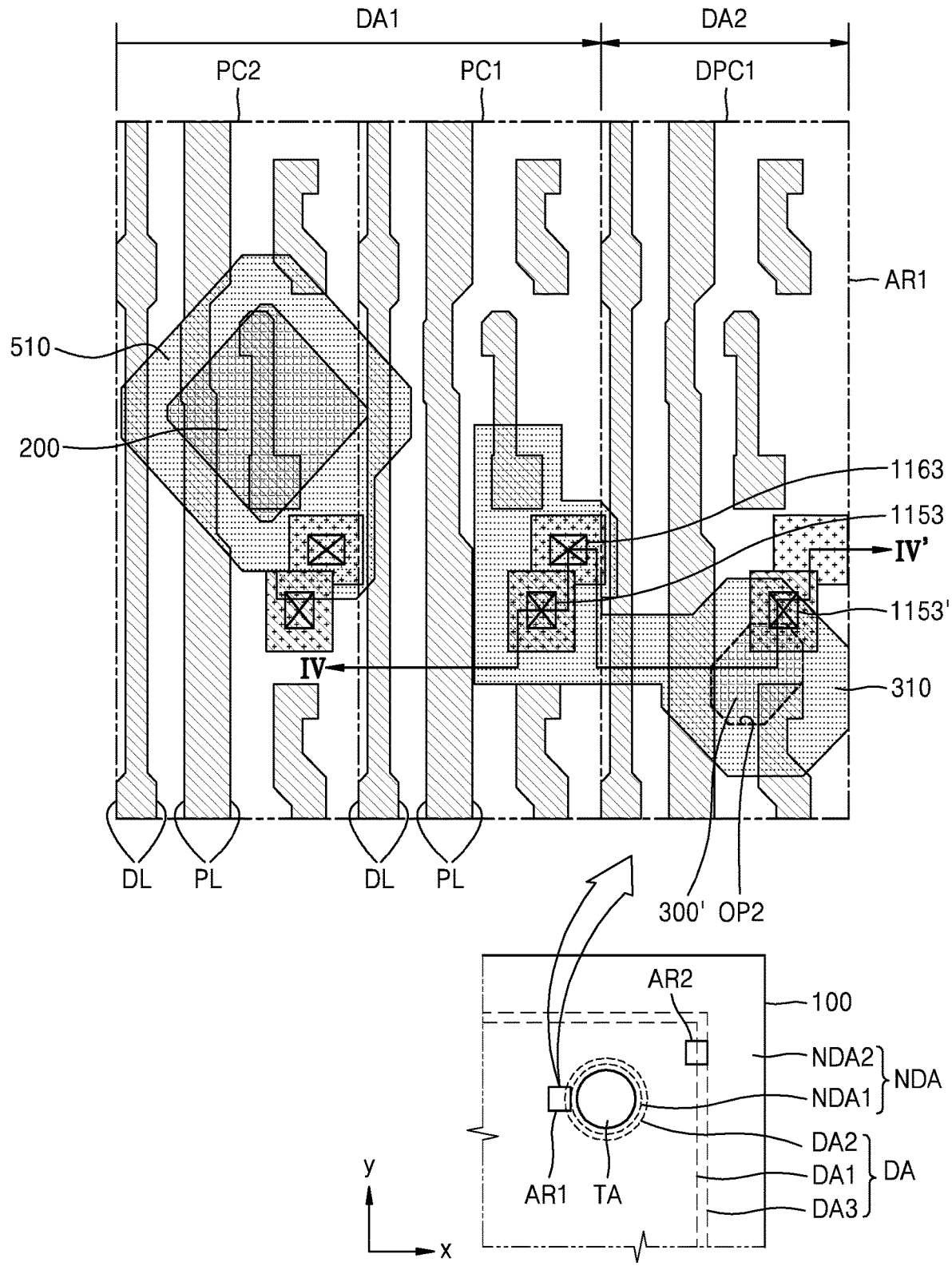
FIG. 6 is a plan view illustrating a part of a display apparatus according to an embodiment of the present disclosure.
Figure 7A:
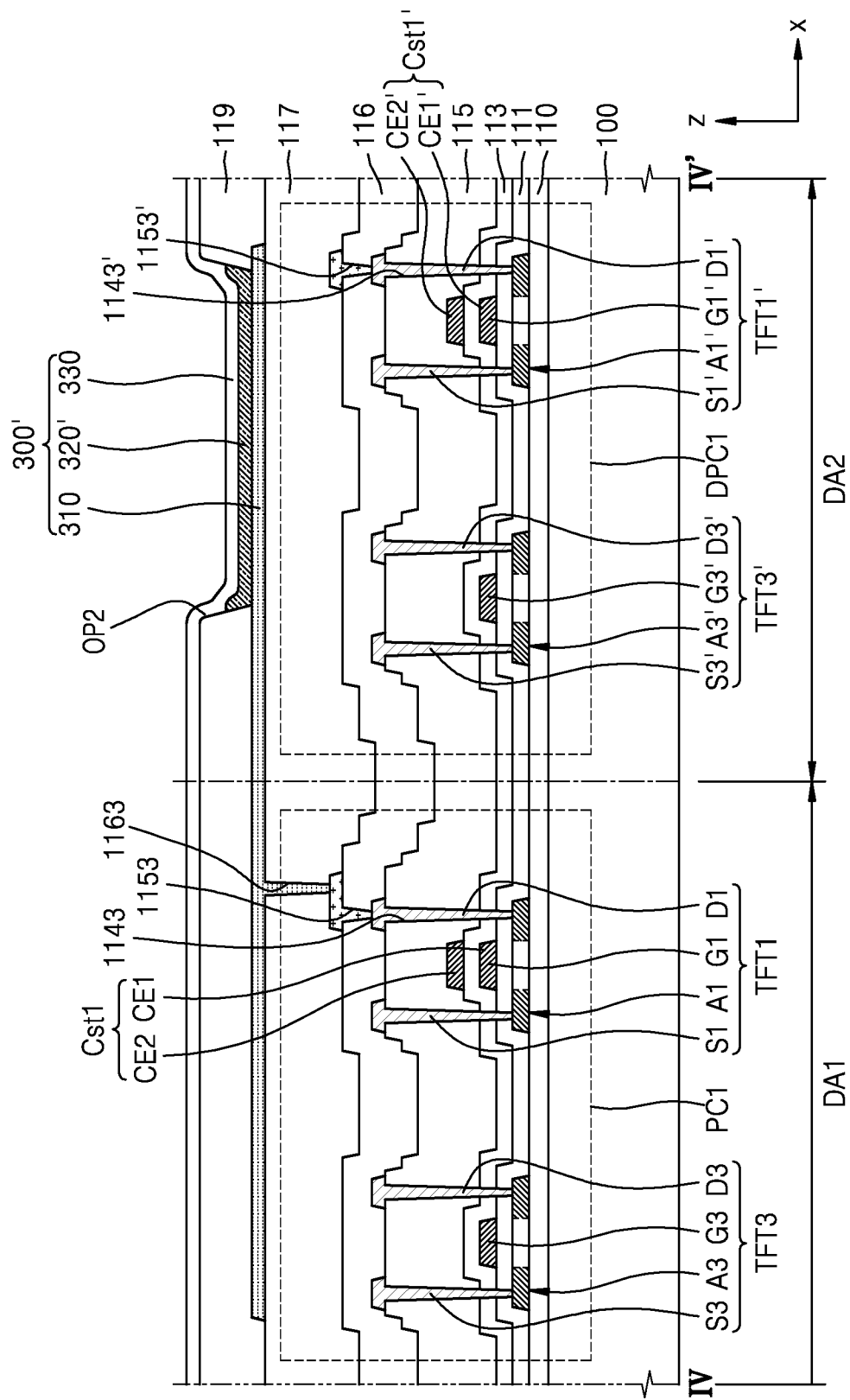
FIGS. 7A and 7B are each a cross-sectional view illustrating a part of a display apparatus according to an embodiment of the present disclosure.
Figure 7B:
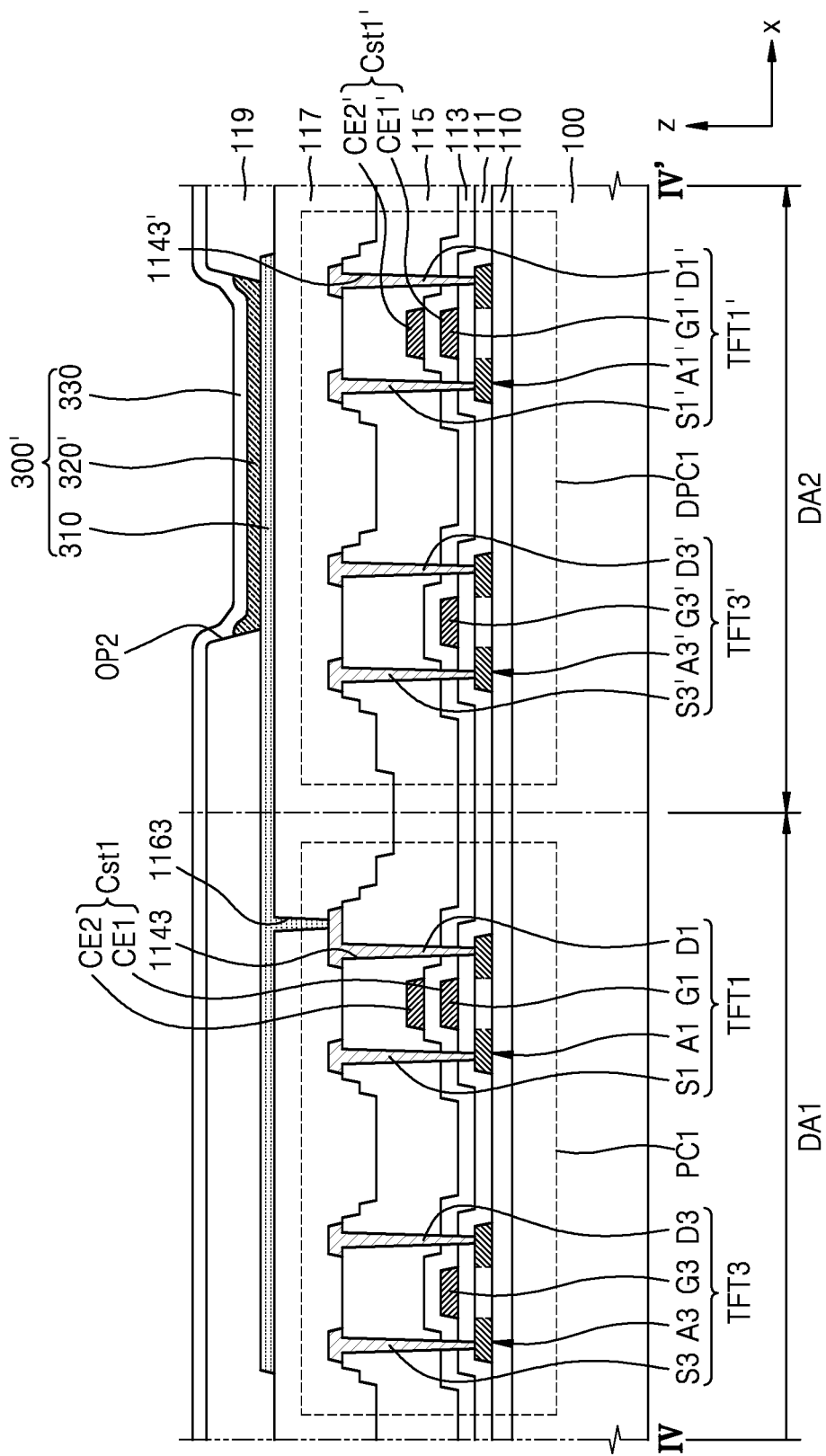

FIG. 6 is a plan view illustrating a part of a display apparatus according to an embodiment of the present disclosure. FIGS. 7A and 7B are each a cross-sectional view illustrating a part of a display apparatus according to an embodiment of the present disclosure, taken along line IV-IV' of 6.

FIG. 6 illustrates a part of the display panel 10 of FIG. 3, and the display panel 10 includes the transmitting area TA, the display area DA, and the non-display area NDA as described above. The non-display area NDA includes the first non-display area NDA1 surrounding the transmitting area TA and the second non-display area NDA2 surrounding (e.g., entirely surrounding) the display area DA. The display area DA includes the second display area DA2 surrounding the first non-display area NDA1, the first display area DA1 surrounding (e.g., entirely surrounding) the second display area DA2, and the third display area DA3 surrounding (e.g., entirely surrounding) the first display area DA1. The first display area DA1 corresponds to a general display area, and the second display area DA2 and the third display area DA3 each correspond to an extended display area according to an embodiment of the present disclosure.

A first area AR1 includes parts of the display area DA1 and the second display area DA2 close to the transmitting area TA, and a second area AR2 includes parts of the first display area DA1 and the third display area DA3.

An enlarged view of FIG. 6 illustrates the first area AR1 including parts of the first display area DA1 and the second display area DA2. The data line DL and the driving voltage line PL pass through the first area AR1, and the first area AR1 includes a first dummy light-emitting unit 300' located in the second display area DA2 and to emit light through the first pixel electrode 310 and a second light-emitting unit 200 located in the first display area DA1 and to emit light through a second pixel electrode 510.

In the present embodiment, a first circuit unit PC1 may include a first TFT TFT1 and a first storage capacitor Cst1, and a first dummy circuit unit DPC1 may include a first dummy TFT TFT1' and a first dummy storage capacitor Cst1', and the first dummy circuit unit DPC1 may be provided at (e.g., on or in) the same layer as the first circuit unit PC1. The first dummy light-emitting unit 300' may be located on the first dummy circuit unit DPC1, and in this case, the first dummy light-emitting unit 300' is driven by the first circuit unit PC1 but overlaps the first dummy circuit unit DPC1.

In more detail, the first dummy light-emitting unit 300' overlapping the first dummy circuit unit DPC1 is connected to the first TFT TFT1 through the contact hole 1163 formed in the planarization layer 117, and emits light due to (e.g., due to being connected to and driven by) the first circuit unit PC1 including the first TFT TFT1. For example, there is no contact hole connected to (e.g., exposing) the first dummy TFT TFT1', and the first dummy light-emitting unit 300' overlaps the first dummy circuit unit DPC1 but is not connected to the first dummy circuit unit DPC1.

The second light-emitting unit 200 that emits light due to the second pixel electrode 510 connected to a second circuit unit PC2 may be located in the first display area DA1, and the first dummy light-emitting unit 300' that emits light due to the first pixel electrode 310 connected to the first circuit unit PC1 may be located in the second display area DA2. Although a light-emitting unit overlapping the first circuit unit PC1 may be located in the first display area DA1 like the second light-emitting unit 200 overlapping the second circuit unit PC2, because the first dummy light-emitting unit 300' is located in the second display area DA2, the display area DA may be extended from the first display area DA1 by (e.g., to) the second display area DA2.

Although the second display area DA2 includes the first dummy circuit unit DPC1, there is no light-emitting unit that emits light due to (e.g., due to being connected to and driven by) the first dummy circuit unit DPC1. However, like in an embodiment of the present disclosure, because the first dummy light-emitting unit 300' that emits light due to the first circuit unit PC1, the first circuit unit PC1 being provided in the first display area DA1, is included in the second display area DA2, damage to the pixel circuit PC (see FIG. 4A) due to static electricity present around the transmitting area TA may be prevented or reduced, and the display area DA may be extended from the first display area DA1 by (e.g., to) the second display area DA2.

Although the first area AR1 near the transmitting area TA has been described, the same description may apply to the second area AR2 including parts of the first display area DA1 and the third display area DA3. For example, the second light-emitting unit 200 that emits light through the second pixel electrode 510 may be located in the first display area DA1 to correspond to the first area AR1, and the first dummy light-emitting unit 300' that emits light through the first pixel electrode 310 may be located in the third display area DA3. For example, a second light-emitting unit, according to the description of the second light-emitting unit 200 in the first display area DA1 of the first area AR1, may be in the first display area DA1 of the second area AR2, and a first dummy light-emitting unit, according to the description of the first dummy light-emitting unit 300' in the second display area DA2 of the first area AR1, may be located in the third display area DA3 of the second area AR2. Accordingly, the first display area DA1 that is a general display area may be extended by (e.g., to) the second display area DA2 and the third display area DA3.

In some embodiments, the first dummy light-emitting unit 300' may exist in the second display area DA2 and the third display area DA3 as well as the first area AR1 and the second area AR2. For example, the first dummy light-emitting unit 300' is not limited to being in the portions of the second display area DA2 and the third display area DA3 respectively corresponding to the first area AR1 and the second area AR2. In some embodiments, the first dummy light-emitting unit 300' may exist in any or all portions of the second display area DA2 and/or the third display area DA3.

Referring FIGS. 7A and 7B, a display apparatus according to an embodiment of the present disclosure includes the first TFT TFT1, the first storage capacitor Cst1, the first dummy TFT TFT1', the first dummy storage capacitor Cst1', and the first dummy light-emitting unit 300' that is a display element, which are located on (e.g., over) the substrate 100. The display apparatus may further include a third TFT TFT3 and a third dummy TFT TFT3'.

Elements included in the display apparatus will be described in more detail according to an example order of stacking the elements with reference to FIG. 7A, and FIG. 7B corresponds to a modification of FIG. 7A and thus will be briefly described.

The substrate 100 may include (e.g., be) a glass material, a ceramic material, a metal material, and/or a suitably flexible or bendable material. When the substrate 100 is flexible or bendable, the substrate 100 may include (e.g., be) a polymer resin such as polyethersulfone, polyacrylate, polyetherimide, polyethylene naphthalate, polyethylene terephthalate, polyphenylene sulfide, polyarylate, polyimide, polycarbonate, and/or cellulose acetate propionate.

The substrate 100 may have a single or multi-layer structure including (e.g., being) the above material, and may further include an inorganic layer when the substrate 100 has a multi-layer structure. In some embodiments, the substrate 100 may have a structure including (e.g., being) organic/inorganic/organic materials.

A barrier layer may be further provided between the substrate 100 and the buffer layer 110. The barrier layer may prevent, reduce, or minimize penetration of impurities from the substrate 100 into semiconductor layers A1, A1', A3, and A3'. The barrier layer may include (e.g., be) an inorganic material such as oxide and/or nitride, an organic material, or a combination of an organic material and an inorganic material, and may have a single or multi-layer structure including (e.g., being) an inorganic material and an organic material.

The semiconductor layers A1, A1', A3, and A3' may be located on the buffer layer 110. Each of the semiconductor layers A1, A1', A3, and A3' may include (e.g., be) amorphous silicon and/or polysilicon. In another embodiment, each of the semiconductor layers A1, A1', A3, and A3' may include (e.g., be) at least one oxide selected from the group consisting of indium (In), gallium (Ga), tin (Sn), zirconium (Zr), vanadium (V), hafnium (Hf), cadmium (Cd), germanium (Ge), chromium (Cr), titanium (Ti), aluminum (Al), cesium (Cs), cerium (Ce), and zinc (Zn).

Each of the semiconductor layers A1, A1', A3, and A3' may include a channel region, and a source region and a drain region located at both sides of the channel region. Each of the semiconductor layers A1, A1', A3, and A3' may have a single or multi-layer structure.

The first gate insulating layer 111 and the second gate insulating layer 113 may be stacked on (e.g., over) the substrate 100 to cover the semiconductor layers A1, A1', A3, and A3'. Each of the first gate insulating layer 111 and the second gate insulating layer 113 may include (e.g., be) silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), and/or zinc oxide ($ZnO_2$).

Gate electrodes G1, G1', G3, and G3' may be located on the first gate insulating layer 111 to at least partially overlap the semiconductor layers A1, A1', A3, and A3'. Although the gate electrodes G1, G1', G3, and G3' are illustrated as located on the first gate insulating layer 111 in FIG. 7A, the present disclosure is not limited thereto, and the gate electrodes G1, G1', G3, and G3' may be located on a top surface of the second gate insulating layer 113 in another embodiment. Also, the gate electrodes G1, G1', G3, and G3' may be located at (e.g., on or in) the same layer or different layers.

In an embodiment, the first storage capacitor Cst1 may include a lower electrode CE1 and an upper electrode CE2, and may overlap the first TFT TFT1 as shown in FIG. 7A. For example, the first gate electrode G1 of the first TFT TFT1 may function as the lower electrode CE1 of the first storage capacitor Cst1. In some embodiments, the first storage capacitor Cst1 may separately exist (e.g., without the first gate electrode G1 of the first TFT TFT1 functioning as the lower electrode CE1), without overlapping the first TFT TFT1.

The upper electrode CE2 of the first storage capacitor Cst1 overlaps the lower electrode CE1 with the second gate insulating layer 113 therebetween, to form capacitance. In this case, the second gate insulating layer 113 may function as a dielectric layer of the first storage capacitor Cst1. Although the first storage capacitor Cst1 has been described, the same description applies to the first dummy storage capacitor Cst1'.

The first interlayer insulating layer 115 and the second interlayer insulating layer 116 may be provided on the second gate insulating layer 113 to cover the upper electrode CE2 of the first storage capacitor Cst1 and an upper electrode CE2' of the first dummy storage capacitor Cst1'. Each of the first interlayer insulating layer 115 and the second interlayer insulating layer 116 may include (e.g., be) silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), and/or zinc oxide ($ZnO_2$).

Source electrodes S1, S1', S3, and S3', drain electrodes D1, D1', D3, and D3', and the data line DL may be located on (e.g., over) the first interlayer insulating layer 115.

Each of the source electrodes S1, S1', S3, and S3', the drain electrodes D1, D1', D3, and D3', and the data line DL may include (e.g., be) a conductive material including molybdenum (Mo), aluminum (Al), copper (Cu), and/or titanium (Ti), and may have a single or multi-layer structure including (e.g., being) the above material. For example, each of the source electrodes S1, S1', S3, and S3', the drain electrodes D1, D1', D3, and D3', and the data line DL may have a multi-layer structure including (e.g., being) Ti/Al/Ti. The source electrodes S1, S1', S3, and S3' and the drain electrodes D1, D1', D3, and D3' may be respectively connected to source regions and drain regions of the semiconductor layers A1, A1', A3, and A3' through the contact hole 1143. As shown in FIGS. 6 and 7A, the first drain electrode D1 and the first dummy drain electrode D1' may be respectively connected to the first semiconductor layer A1 and the first dummy semiconductor layer A1' through the contact holes 1143 and 1143' formed in the first gate insulating layer 111, the second gate insulating layer 113, and the first interlayer insulating layer 115.

The source electrodes S1, S1', S3, and S3' and the drain electrodes D1, D1', D3, and D3' may be covered by an inorganic protective layer. The inorganic protective layer may have a single or multi-layer structure including (e.g., being) silicon nitride ($SiN_x$) and/or silicon oxide ($SiO_x$). The inorganic protective layer may cover and protect some wirings located on the first interlayer insulating layer 115.

The second interlayer insulating layer 116 may be located to cover the source electrodes S1, S1', S3, and S3' and the drain electrodes D1, D1', D3, and D3', and the second interlayer insulating layer 116 may have the contact hole 1153 for connecting the first TFT TFT1 and the first pixel electrode 310.

Although FIG. 7A illustrates the first interlayer insulating layer 115 and the second interlayer insulating layer 116 are provided on (e.g., over) the substrate 100 and the first TFT TFT1 and the first pixel electrode 310 are connected through the contact holes 1143, 1153, and 1163 respectively passing through the first interlayer insulating layer 115, the second interlayer insulating layer 116, and the planarization layer 117, the present disclosure is not limited thereto. In some embodiments, only the first interlayer insulating layer 115 from among the first and second interlay insulating layers 115 and 116 may be provided and the first TFT TFT1 and the first pixel electrode 310 may be connected through the contact hole 1143 passing through the first interlayer insulating layer 115 and the contact hole 1163 passing through the planarizaton layer 117 as shown in FIG. 7B.

The planarization layer 117 may be located on the second interlayer insulating layer 116, and the first dummy light-emitting unit 300' may be located on the planarization layer 117.

The planarization layer 117 may have a single or multi-layer structure including (e.g., being) an organic material, and may have a flat top surface. The planarization layer 117 may include (e.g., be) benzocyclobutene (BCB), polyimide, hexamethyldisiloxane (HMDSO), a general-purpose polymer such as polymethyl methacrylate (PMMA) and/or polystyrene (PS), a polymer derivative having a phenol-based group, an acrylic polymer, an imide-based polymer, an aryl ether-based polymer, an amide-based polymer, a fluorinated polymer, a p-xylene-based polymer, a vinyl alcohol-based polymer, or a blend thereof.

The first dummy light-emitting unit 300' is located on the planarization layer 117. The first dummy light-emitting unit 300' includes the first pixel electrode 310, a second intermediate layer 320' including an organic emission layer, and an opposite electrode 330.

The first pixel electrode 310 may be connected to the first drain electrode D1 of the first TFT TFT1 through the contact hole 1163 formed in the planarization layer 117, and may be a (semi) light-transmitting electrode or a reflective electrode. In some embodiments, the first pixel electrode 310 may include a reflective film formed of silver (Ag), magnesium (Mg), aluminum (Al), platinum (Pt), palladium (Pd), gold (Au), nickel (Ni), neodymium (Nd), iridium (Ir), chromium (Cr), or a compound thereof, and a transparent or semi-transparent electrode layer formed on the reflective film. The transparent or semi-transparent electrode layer may include (e.g., be) at least one selected from the group consisting of indium tin oxide (ITO), indium zinc oxide (IZO), zinc oxide (ZnO), indium oxide ($In_2O_3$), indium gallium oxide (IGO), and aluminum zinc oxide (AZO). In some embodiments, the first pixel electrode 310 may be formed of ITO/Ag/ITO.

A pixel defining layer 119 may be located on the planarization layer 117 in the display area DA (see FIG. 1) of the substrate 100. Also, the pixel defining layer 119 may increase a distance between an edge of the first pixel electrode 310 and the opposite electrode 330 located on (e.g., over) the first pixel electrode 310, to prevent or block an arc or the like from occurring on the edge of the first pixel electrode 310. For example, in some embodiments, the pixel defining layer 119 may be located on the planarization layer 117 and may cover one portion (e.g., the edges) of the first pixel electrode 310, and the pixel defining layer 119 may have a second opening OP2 exposing another portion of the first pixel electrode 310.

The pixel defining layer 119 may be formed of at least one organic insulating material selected from the group consisting of polyimide, polyamide, acrylic resin, benzocyclobutene, hexamethyldisiloxane, and phenolic resin by utilizing spin coating and/or the like.

The second intermediate layer 320' of the first dummy light-emitting unit 300' may be located in the second opening OP2 formed by the pixel defining layer 119, and may include the organic emission layer. The organic emission layer may include (e.g., be) an organic material including a fluorescent and/or phosphorescent material that emits red, green, blue, or white light. The organic emission layer may be formed of a low molecular weight organic material or a high molecular weight organic material, and functional layers such as a hole transport layer (HTL), a hole injection layer (HIL), an electron transport layer (ETL), and/or an electron injection layer (EIL) may be arranged, for example, under and over the organic emission layer.

The opposite electrode 330 may be a light-transmitting electrode or a reflective electrode. In some embodiments, the opposite electrode 330 may be a transparent or semi-transparent electrode and may formed of a metal thin film having a low work function and including (e.g., being) lithium (Li), calcium (Ca), LiF/Ca, LiF/Al, Al, Ag, Mg, or a compound thereof. Also, a transparent conductive oxide (TCO) film such as ITO, IZO, ZnO, and/or $In_2O_3$ may be further located on the metal thin film. The opposite electrode 330 may be located over the display area DA, and may be located on the second intermediate layer 320' and the pixel defining layer 119. The opposite electrode 330 may be integrally formed with a plurality of OLEDs to correspond to a plurality of pixel electrodes 310 and 510.

In the present embodiment, the first dummy light-emitting unit 300' is connected to and driven by the first circuit unit PC1 through the contact holes 1143, 1153, and 1163 respectively formed in the first interlayer insulating layer 115, the second interlayer insulating layer 116, and the planarization layer 117, but overlaps the first dummy circuit unit DPC1. For example, the first dummy light-emitting unit 300' is located in the second display area DA2 in which the first dummy circuit unit DPC1 is located.

As shown in FIG. 7A, electrode layers located on the first interlayer insulating layer 115 and the second interlayer insulating layer 116 may be connected to the first dummy semiconductor layer A1' of the first dummy circuit unit DPC1 through the contact holes 1143' and 1153' passing through the first interlayer insulating layer 115 and the second interlayer insulating layer 116. As shown in FIG. 7B, electrode layers on the first interlayer insulating layer 115 may be connected to the first dummy semiconductor layer A1' of the first dummy circuit unit DPC1 through the contract hole 1143' passing through the first interlayer insulating layer 115.

In contrast, there may be no contact hole (e.g., a contact hole passing through the planarization layer 117) connected to an electrode layer located on the second interlayer insulating layer 116 and connected to the first dummy semiconductor layer A1'. For example, the first dummy light-emitting unit 300' is not driven by the first dummy circuit unit DPC1 but is driven by the first circuit unit PC1 as described above.

FIGS. 7A and 7B illustrate that the planarization layer 117 does not include a contact hole to connect the first dummy light-emitting unit 300' to the first dummy circuit unit DPC1, and because at least one selected from among the first interlayer insulating layer 115, the second interlayer insulating layer 116, and the planarization layer 117 does not include a contact hole, the first dummy light-emitting unit 300' and the first dummy circuit unit DPC1 may not be connected. For example, the contact hole 1153' passing through the second interlayer insulating layer 116 may not be provided, or both the contact holes 1143' and 1153' respectively passing through the first interlayer insulating layer 115 and the second interlayer insulating layer 116 may not be provided.

As described above, according to the present embodiment, because the first dummy light-emitting unit 300' that emits light due to the first circuit unit PC1, the first circuit unit PC1 being provided in the first display area DA1, is located in the second display area DA2, damage to the pixel circuit PC (e.g., the pixel circuit of the first circuit unit PC1) due to static electricity present around the transmitting area TA may be prevented or reduced.

Figure 8:
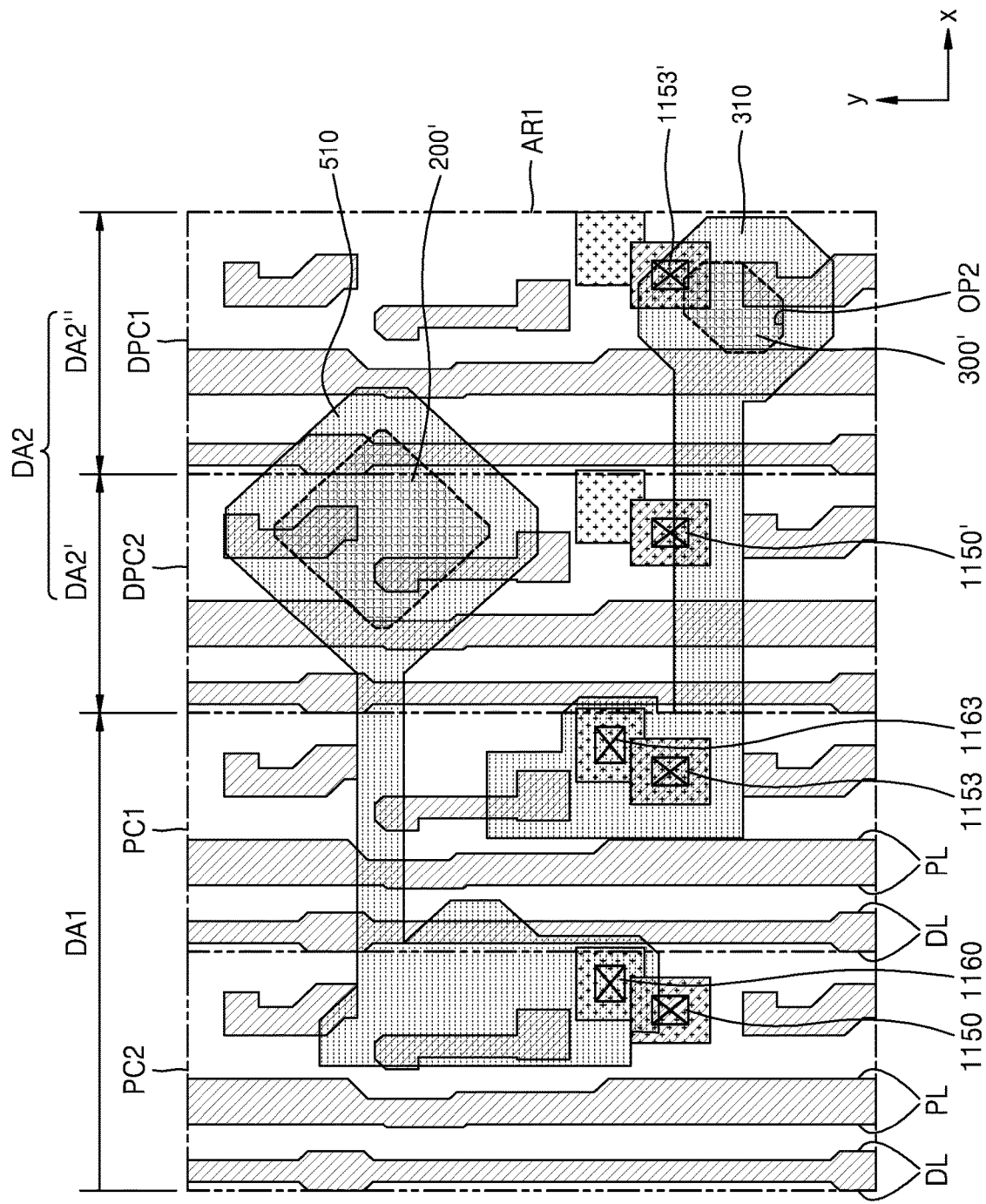
FIG. 8 is a plan view illustrating a part of a display apparatus according to an embodiment of the present disclosure.

FIG. 8 is a plan view illustrating a part of a display apparatus according to an embodiment of the present disclosure.

Referring to FIG. 8, a display apparatus according to an embodiment of the present disclosure may further include the second circuit unit PC2 including a second TFT and a second storage capacitor and a second dummy circuit unit DPC2 including a second dummy TFT and a second dummy storage capacitor, and may further include a second dummy light-emitting unit 200' that emits light due to (e.g., due to being connected to and driven by) the second circuit unit PC2.

As described with reference to FIGS. 6, 7A, and 7B, the first pixel electrode 310 is connected to the first circuit unit PC1 by the contact hole 1163 formed in the planarization layer 117, and the first dummy light-emitting unit 300' that emits light due to the first circuit unit PC1 overlaps the first dummy circuit unit DPC1 and is located in the second display area DA2.

The second circuit unit PC2 including the second TFT and the second storage capacitor corresponds to the first circuit unit PC1 including the first TFT TFT1 and the first storage capacitor Cst1 shown in FIG. 7A. Also, the second dummy circuit unit DPC2 including the second dummy TFT and the second dummy storage capacitor corresponds to the first dummy circuit unit DPC1 including the first dummy TFT TFT1' and the first dummy storage capacitor Cst1'. For example, the structure of the second circuit unit PC2 and the second dummy circuit unit DPC2 may respectively correspond to the description of the structure of the first circuit unit PC1 and the first dummy circuit unit DPC1.

A second drain electrode of the second TFT and a second dummy drain electrode of the second dummy TFT may be respectively connected to a second semiconductor layer of the second TFT and a second dummy semiconductor layer of the second dummy TFT through contact holes formed in the first gate insulating layer 111, the second gate insulating layer 113, and the first interlayer insulating layer 115 and contact holes 1150 and 1150' formed in the second interlayer insulating layer 116. Also, the second pixel electrode 510 may be connected to the second drain electrode of the second TFT through a contact hole 1160 formed in the planarization layer 117.

As such, the second pixel electrode 510 is connected to the second circuit unit PC2 located in the first display area DA1 by the contact hole 1160 formed in the planarization layer 117, and the second dummy light-emitting unit 200' that emits light due to the second pixel electrode 510 overlaps the second dummy circuit unit DPC2 and is located in the second display area DA2.

Referring to FIG. 8, the second dummy light-emitting unit 200' that emits light due to the second pixel electrode 510 may be located in a left portion DA2' of the second display area DA2, and the first dummy light-emitting unit 300' that emits light due to the first pixel electrode 310 may be located in a right portion DA2" of the second display area DA2. Although a light-emitting unit may be located in the first display area DA1 to overlap the first circuit unit PC1 and the second circuit unit PC2, because the first dummy light-emitting unit 300' and the second dummy light-emitting unit 200' are located in the second display area DA2, the display area DA may be extended from the first display area DA1 by (e.g., to) the second display area DA2.

Although the second dummy light-emitting unit 200' and the first dummy light-emitting unit 300' are respectively located in the left portion DA2' and the right portion DA2" of the second display area DA2 in FIG. 8, two or more light-emitting units may be located in the second display area DA2 in an embodiment.

Because the first dummy light-emitting unit 300' and the second dummy light-emitting unit 200' that respectively emit light due to the first circuit unit PC1 and the second circuit unit PC2, the first circuit unit PC1 and the second circuit unit PC2 being provided in the first display area DA1, are located in the second display area DA2 according to an embodiment of the present disclosure, damage to the pixel circuit PC (see FIG. 4A) (e.g., the pixel circuits of the first circuit unit PC1 and the second circuit unit PC2) due to static electricity present around the transmitting area TA may be prevented or reduced, and the display area DA may be extended from the first display area DA1 by (e.g., to) the second display area DA2.

Although the first area AR1 near the transmitting area TA has been described, the same description may apply to the second area AR2 including parts of the first display area DA1 and the third display area DA3.

In some embodiments, the first dummy light-emitting unit 300' and the second dummy light-emitting unit 200' may exist in the second display area DA2 and the third display area DA3 as well as the first area AR1 and the second area AR2. For example, the first dummy light-emitting unit 300' and the second dummy light-emitting unit 200' are not limited to being in the portions of the second display area DA2 and the third display area DA3 respectively corresponding to the first area AR1 and the second area AR2. In some embodiments, the first dummy light-emitting unit 300' and the second dummy light-emitting unit 200' may exist in any or all portions of the second display area DA2 and the third display area DA3.

Figure 9:
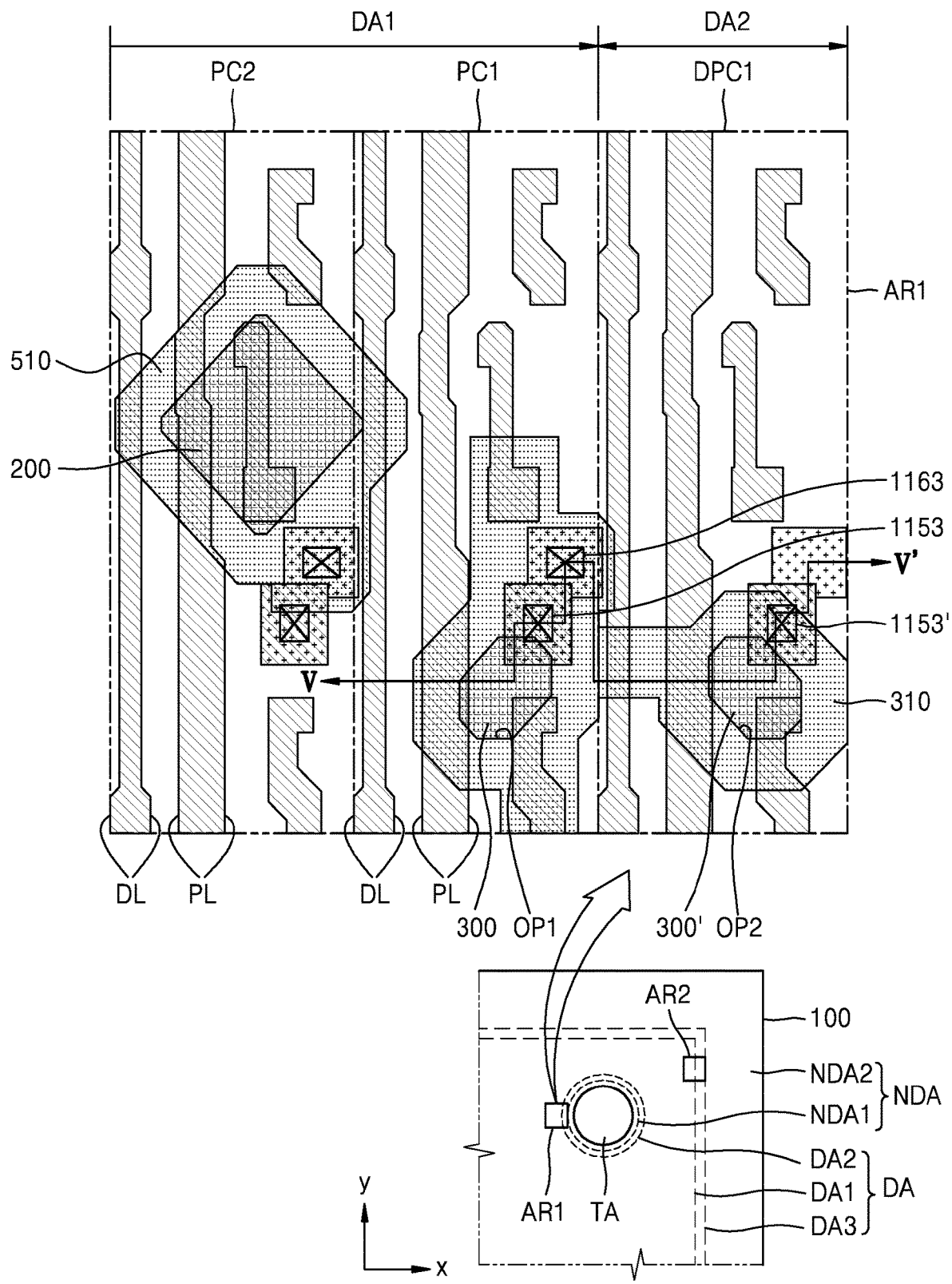
FIG. 9 is a plan view illustrating a part of a display apparatus according to an embodiment of the present disclosure.
Figure 10A:
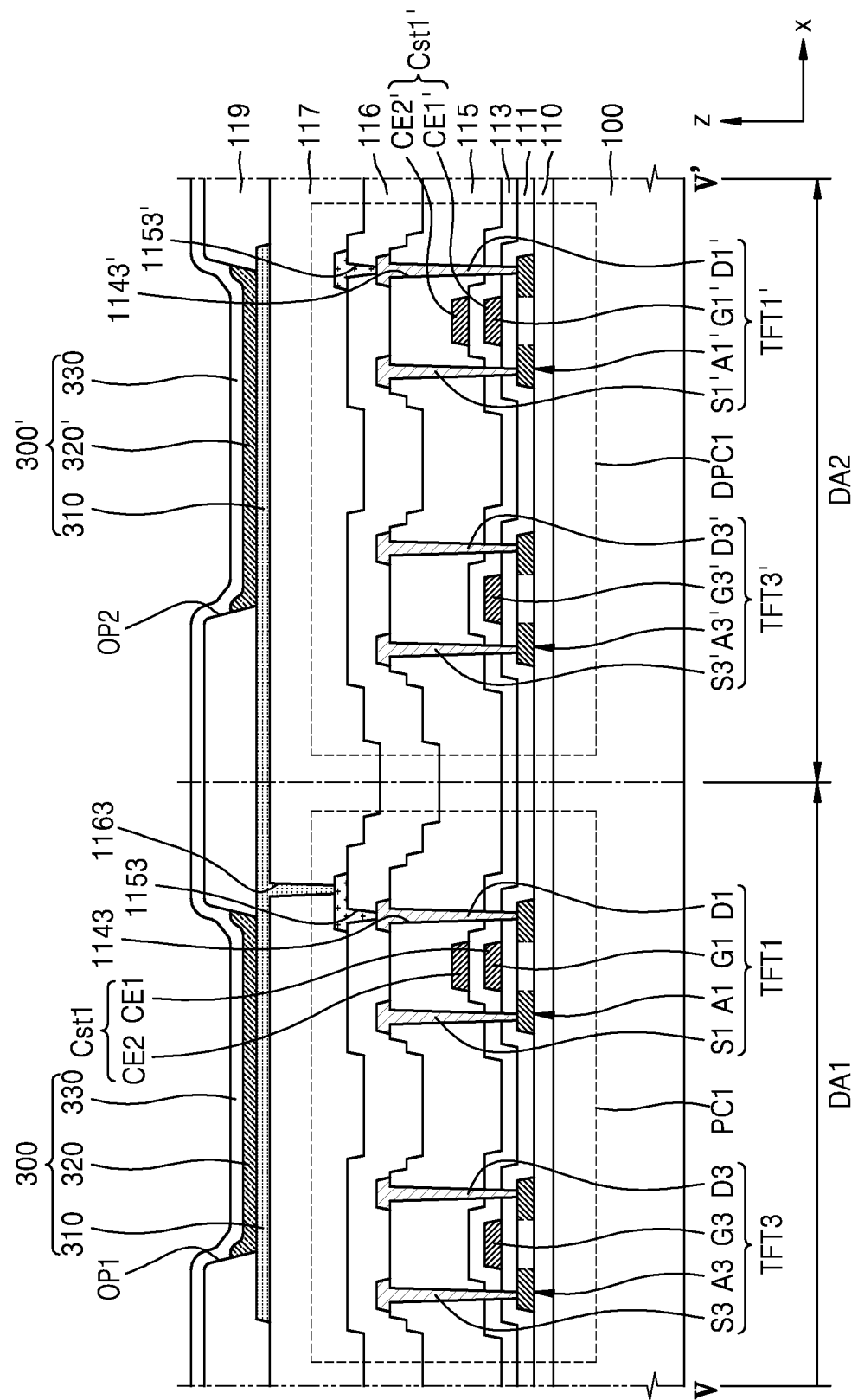
FIGS. 10A and 10B are each a cross-sectional view illustrating a part of a display apparatus according to an embodiment of the present disclosure.
Figure 10B:
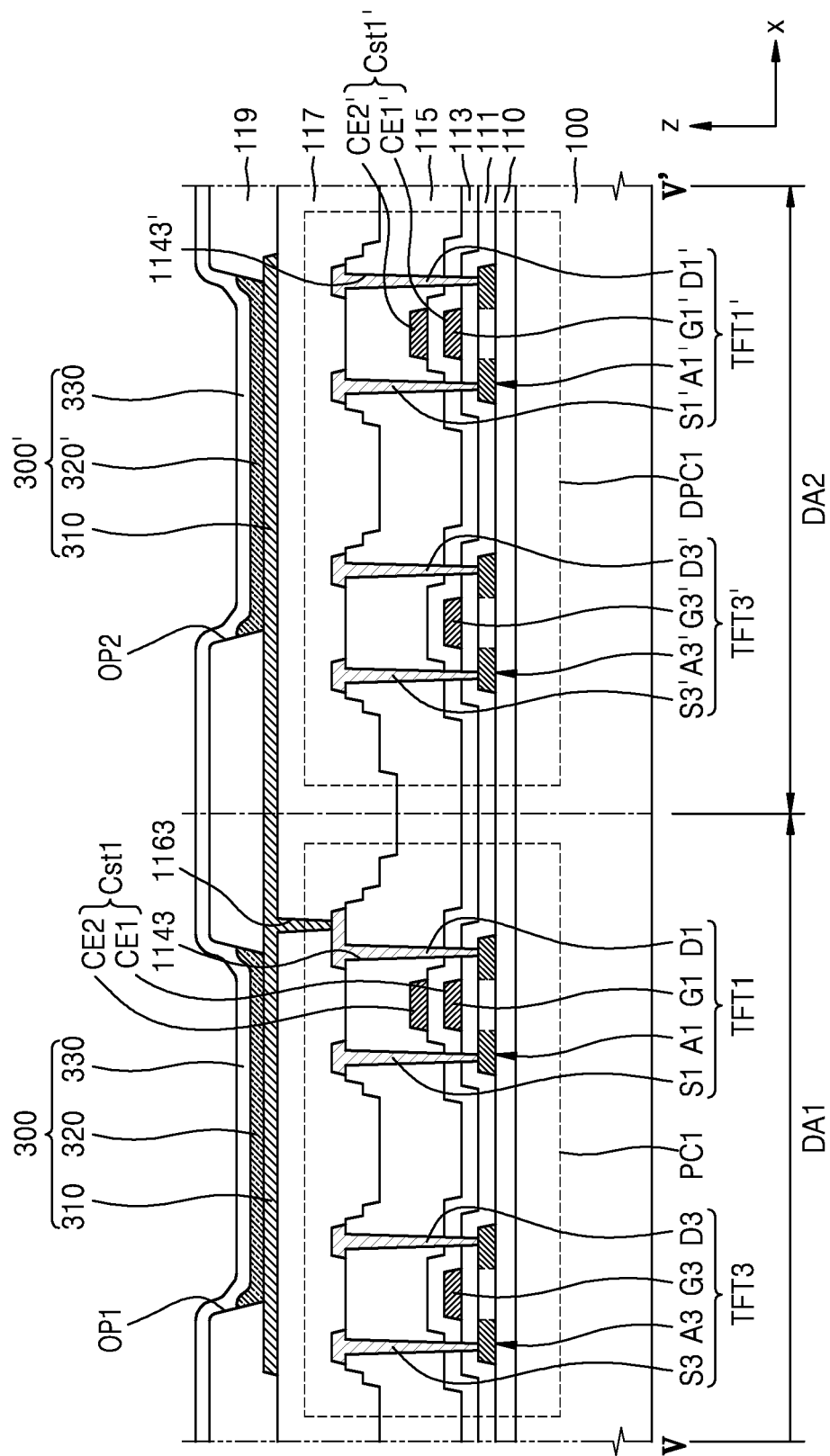

FIG. 9 is a plan view illustrating a part of a display apparatus according to an embodiment of the present disclosure. FIGS. 10A and 10B are each a cross-sectional view illustrating a part of a display apparatus according to an embodiment of the present disclosure, taken along line V-V of FIG. 9. In FIGS. 9, 10A, and 10B, the same members as those in FIGS. 6, 7A, and 7B are denoted by the same reference numerals, and thus a repeated explanation thereof will not be given.

Referring to FIG. 9, a display apparatus according to the present embodiment may include the first circuit unit PC1 including the first TFT TFT1 and the first storage capacitor Cst1, and the first pixel electrode 310 located on the first circuit unit PC1 and connected to the first TFT TFT1. Also, the display apparatus may include the pixel defining layer 119 covering an edge of the first pixel electrode 310 and including a first opening OP1 and the second opening OP2 through which a part of the first pixel electrode 310 is exposed, the first intermediate layer 320 and the second intermediate layer 320' respectively located in the first opening OP1 and the second opening OP2, and the opposite electrode 330 located on the pixel defining layer 119 and covering the first intermediate layer 320 and the second intermediate layer 320'. For example, the pixel defining layer 119 may cover the edges of the first pixel electrode 310 and may also cover a portion (e.g., a center portion) of the first pixel electrode 310 between the first opening OP1 and the second opening OP2. For example, when compared to an embodiment of FIG. 6, the present embodiment may further include the first light-emitting unit 300 driven by the first circuit unit PC1 and overlapping the first circuit unit PC1.

The first opening OP1 may be located in the first display area DA1 to overlap the first circuit unit PC1, and the second opening OP2 may be located in the second display area DA2 to overlap the first dummy circuit unit DPC1. In some embodiments, the first opening OP1 may be located in the second display area DA2. In some embodiments, both the first opening OP1 and the second opening OP2 may be located in the first display area DA1 or the second display area DA2.

The second light-emitting unit 200 that emits light due to the second pixel electrode 510 and the first light-emitting unit 300 that emits light due to the first pixel electrode 310 may be located in the first display area DA1, and the first dummy light-emitting unit 300' that emits light due to the first pixel electrode 310 may be located in the second display area DA2. For example, light-emitting units (e.g., the first and second light-emitting units 300 and 200) may be located in the first display area DA1 to respectively correspond to the first circuit unit PC1 and the second circuit unit PC2, and in addition, because the first dummy light-emitting unit 300' is located in the second display area DA2, the display area DA may be extended from the first display area DA1 by (e.g., to) the second display area DA2.

Because the first dummy light-emitting unit 300' that emits light due to the first circuit unit PC1, the first circuit unit PC1 being provided in the first display area DA1, is further located in the second display area DA2 according to an embodiment of the present disclosure, damage to the pixel circuit PC due to static electricity present around the transmitting area TA may be prevented or reduced, and the display area DA may be extended from the first display area DA1 by (e.g., to) the second display area DA2. Also, when compared to an embodiment of FIG. 6, because the first light-emitting unit 300 is further located in the first display area DA1 according to the present embodiment, a luminance may be increased.

Although the first area AR1 near the transmitting area TA has been described, the same description may apply to the second area AR2 including the first display area DA1 and the third display area DA3.

Referring to FIG. 10A, when compared to FIG. 7A, the pixel defining layer 119 further includes the first opening OP1 and the first intermediate layer 320 is located in the first opening OP1. The opposite electrode 330 covering the first intermediate layer 320 is provided, and the first light-emitting unit 300 including the first pixel electrode 310, the first intermediate layer 320, and the opposite electrode 330 is further provided. The first light-emitting unit 300 is driven by the first circuit unit PC1, and overlaps the first circuit unit PC1.

According to an embodiment of FIG. 10A, because the first light-emitting unit 300 is further located in the first display area DA1, a luminance may be increased.

FIG. 10B corresponds to a modification of FIG. 10A, and as described with reference to FIG. 7B, only the first interlayer insulating layer 115 may be provided from among the first interlayer insulating layer 115 and the second interlayer insulating layer 116, and the first TFT TFT1 and the first pixel electrode 310 may be connected through the contact hole 1143 passing through the first interlayer insulating layer 115 and the contact hole 1163 passing through the planarization layer 117.

Figure 11:
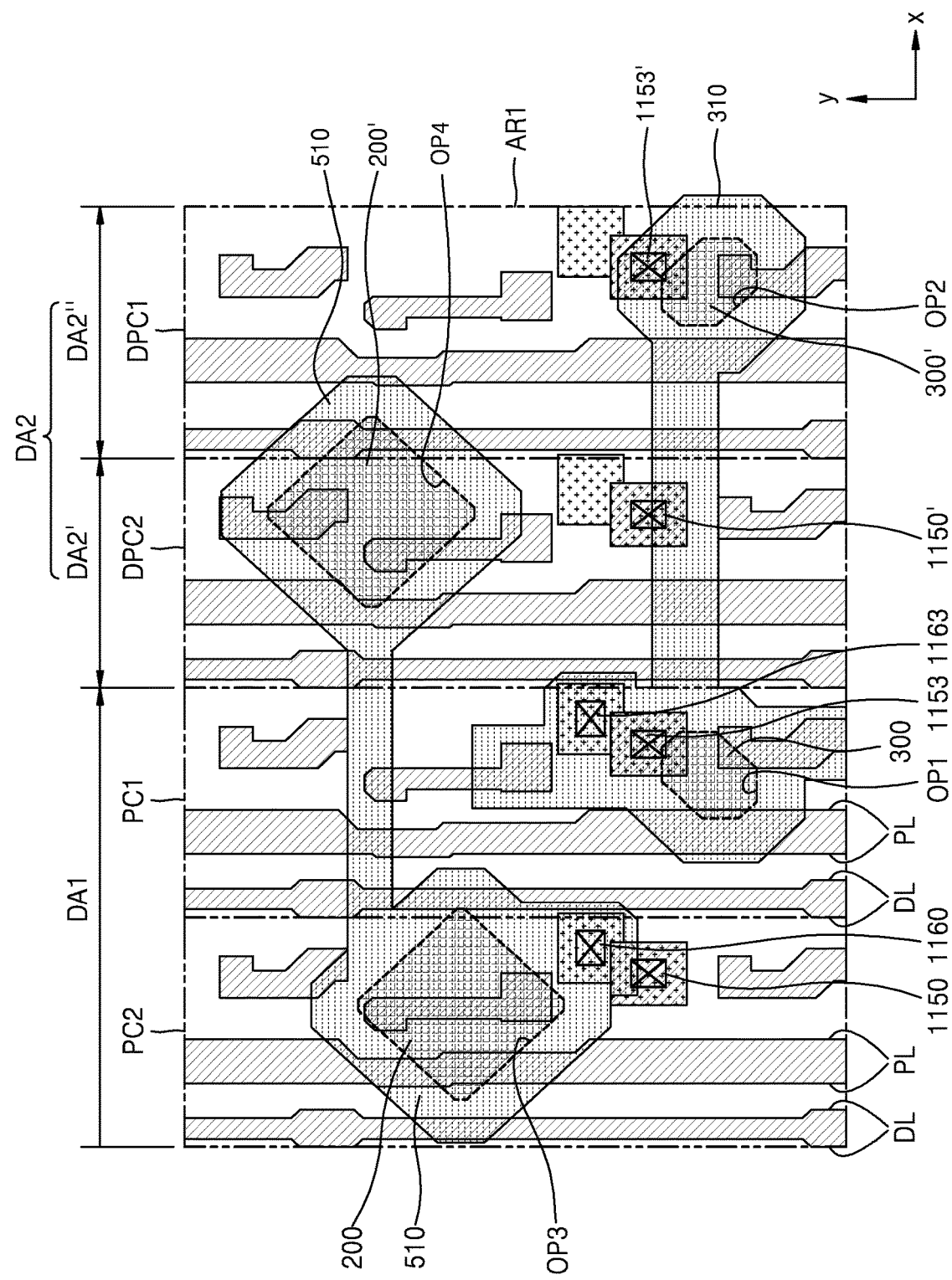
FIG. 11 is a plan view illustrating a part of a display apparatus according to an embodiment of the present disclosure.

FIG. 11 is a plan view illustrating a part of a display apparatus according to an embodiment of the present disclosure.

Referring to FIG. 11, a display apparatus according to an embodiment of the present disclosure may further include the second circuit unit PC2 including the second TFT and the second storage capacitor and the second dummy circuit unit DPC2 including the second dummy TFT and the second dummy storage capacitor, and may further include the second dummy light-emitting unit 200' that emits light due to the second circuit unit PC2.

As described with reference to FIGS. 9 and 10A, the first pixel electrode 310 is connected to the first circuit unit PC1 by the contact hole 1163 formed in the planarization layer 117. The pixel defining layer 119 may cover an edge of the first pixel electrode 310, and may include the first opening OP1 and the second opening OP2 through which a part of the first pixel electrode 310 is exposed. The first intermediate layer 320 and the second intermediate layer 320' may be respectively located in the first opening OP1 and the second opening OP2, and the opposite electrode 330 may be located on the pixel defining layer 119 to cover the first intermediate layer 320 and the second intermediate layer 320', and thus two light-emitting units may be provided on the first pixel electrode 310.

In another embodiment of a display apparatus of the present disclosure, the second circuit unit PC2 may include the second TFT and the second storage capacitor, and the display apparatus may further include the second pixel electrode 510 connected to the second TFT and located on the second circuit unit PC2. Also, the pixel defining layer 119 may cover an edge of the second pixel electrode 510, and may further include a third opening OP3 and a fourth opening OP4 through which a part of the second pixel electrode 510 is exposed. A third intermediate layer and a fourth intermediate layer may be respectively located in the third opening OP3 and the fourth opening OP4, the opposite electrode 330 may be located on the pixel defining layer 119 to cover the third intermediate layer and the fourth intermediate layer, and thus two light-emitting units may be provided on the second pixel electrode 510.

The second circuit unit PC2 including the second TFT and the second storage capacitor corresponds to the first circuit unit PC1 including the first TFT TFT1 and the first storage capacitor Cst1 in FIG. 10A. Also, the second dummy circuit unit DPC2 including the second dummy TFT and the second dummy storage capacitor corresponds to the first dummy circuit unit DPC1 including the first dummy TFT TFT1' and the first dummy storage capacitor Cst1'. For example, the structure of the second circuit unit PC2 and the second dummy circuit unit DPC2 may respectively correspond to the description of the structure of the first circuit unit PC1 and the first dummy circuit unit DPC1.

A second drain electrode and a second dummy drain electrode may be respectively connected to a second semiconductor layer and a second dummy semiconductor layer through contact holes formed in the first gate insulating layer 111, the second gate insulating layer 113, and the first interlayer insulating layer 115 and the contact holes 1150 and 1150' formed in the second interlayer insulating layer 116.

The second pixel electrode 510 may be connected to the second drain electrode of the second TFT through the contact hole 1160 formed in the planarization layer 117. As such, the second pixel electrode 510 is connected to the second circuit unit PC2 located in the first display area DA1 by the contact hole 1160 formed in the planarization layer 117, and the second light-emitting unit 200 that emits light due to the second pixel electrode 510 is located in the first display area DA1 and the second dummy light-emitting unit 200' that emits light due to the second pixel electrode 510 is located in the second display area DA2.

As shown in FIG. 11, the first opening OP1 and the third opening OP3 may be located in the first display area DA1, and the second opening OP2 and the fourth opening OP4 may be located in the second display area DA2. In some embodiments, the first opening OP1 and the third opening OP3 may be located in the second display area DA2. In some embodiments, all of the first opening OP1, the second opening OP2, the third opening OP3, and the fourth opening OP4 may be located in the first display area DA1 or the second display area DA2.

Referring to FIG. 11, the second dummy light-emitting unit 200' that emits light due to the second pixel electrode 510 may be located in the left portion DA2' of the second display area DA2, and the first dummy light-emitting unit 300' that emits light due to the first pixel electrode 310 may be located in the right portion DA2" of the second display area DA2. The first light-emitting unit 300 and the second light-emitting unit 200 may be located in the first display area DA1 to respectively correspond to the first circuit unit PC1 and the second circuit unit PC2. Because the first dummy light-emitting unit 300' and the second dummy light-emitting unit 200' are located in the second display area DA2, the display area DA may be extended from the first display area DA1 by (e.g., to) the second display area DA2.

Although the second dummy light-emitting unit 200' and the first dummy light-emitting unit 300' are respectively illustrated in the left portion DA2' and the right portion DA2" of the second display area DA2 in FIG. 11, two or more light-emitting units may be located in the second display area DA2 in an embodiment.

Because the first dummy light-emitting unit 300' and the second dummy light-emitting unit 200' that respectively emit light due to the first circuit unit PC1 and the second circuit unit PC2, the first circuit unit PC1 and the second circuit unit PC2 being provided in the first display area DA1, are located in the second display area DA2 according to an embodiment of the present disclosure, damage to the pixel circuit PC due to static electricity present around the transmitting area TA may be prevented or reduced, and the display area DA may be extended from the first display area DA1 by (e.g., to) the second display area DA2. Also, when compared to an embodiment of FIG. 8, because the first light-emitting unit 300 is further located in the first display area DA1 according to the present embodiment, a luminance may be increased.

In some embodiments, the first dummy light-emitting unit 300' and the second dummy light-emitting unit 200' may exist in the second display area DA2 and the third display area DA3 as well as the first area AR1 and the second area AR2.

Figure 12:
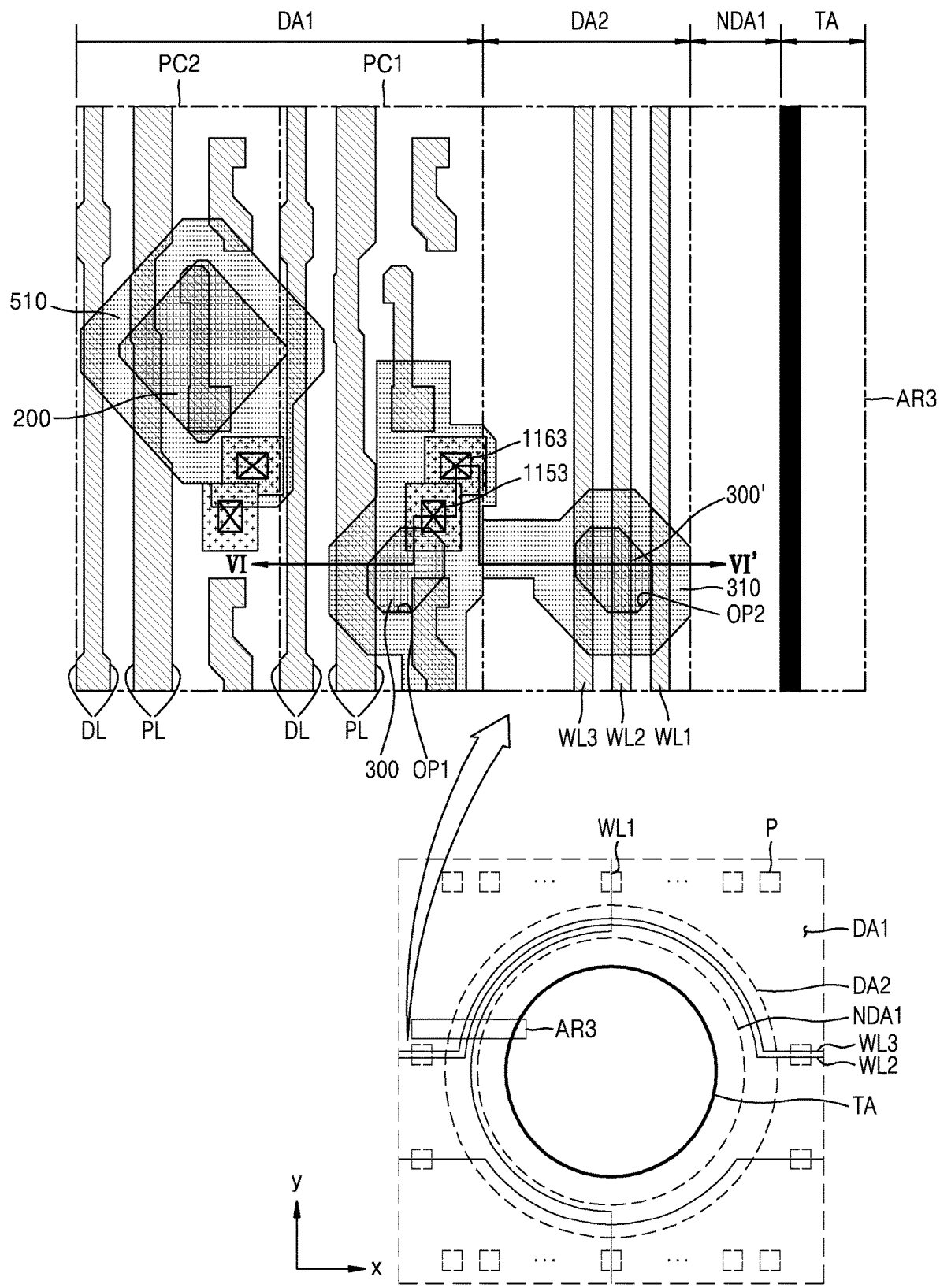
FIG. 12 is a plan view illustrating a part of a display apparatus according to an embodiment of the present disclosure.
Figure 13:
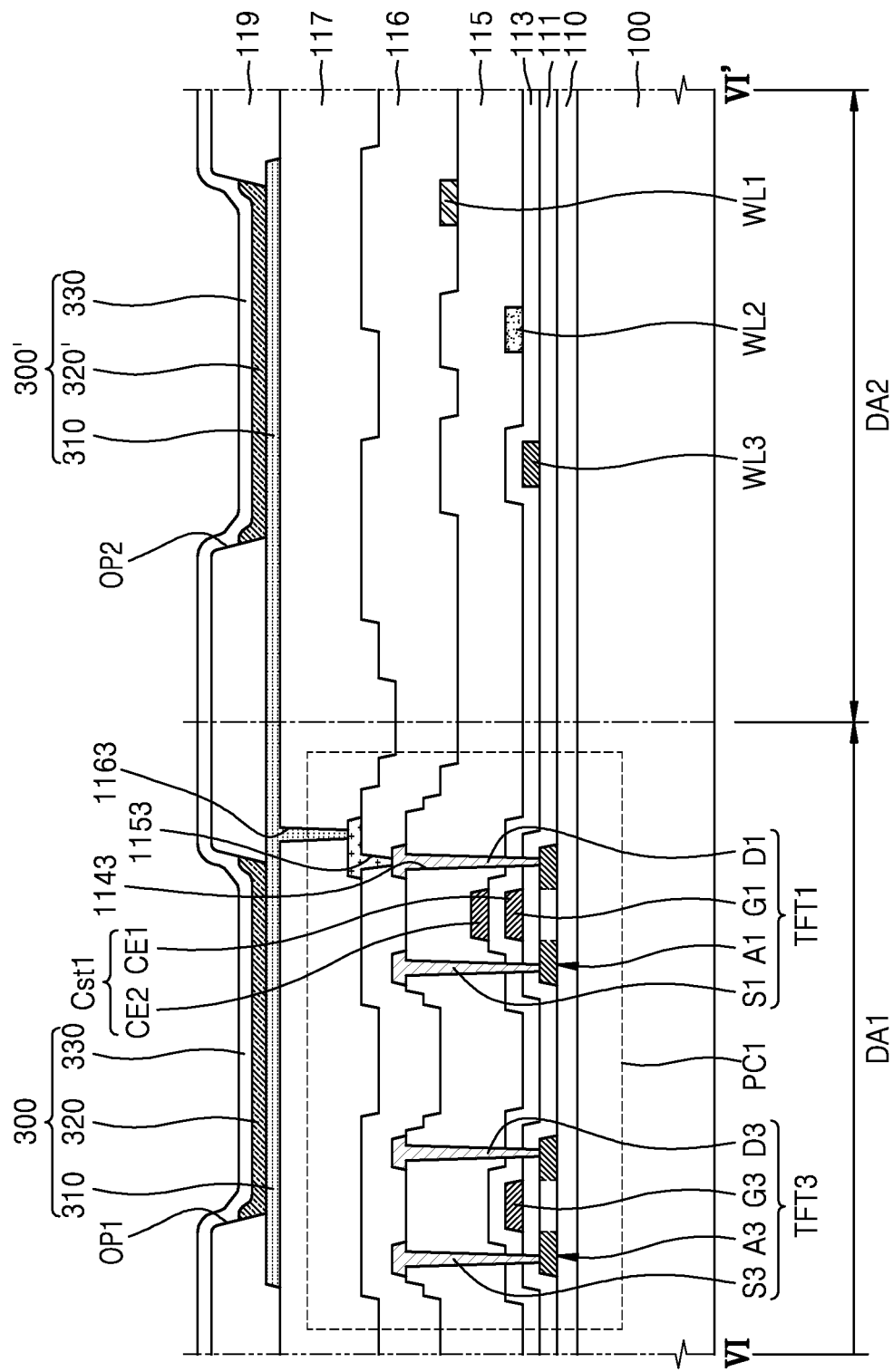
FIG. 13 is a cross-sectional view illustrating a part of a display apparatus according to an embodiment of the present disclosure.

FIG. 12 is a plan view illustrating a part of a display apparatus according to an embodiment of the present disclosure, particularly illustrating signal lines located in a second display area. FIG. 13 is a cross-sectional view illustrating a part of a display apparatus according to an embodiment of the present disclosure, taken along line VI-VI' of FIG. 12. In FIGS. 12 and 13, the same members as those of FIGS. 6, 7A, and 7B are denoted by the same reference numerals, and thus a repeated explanation thereof will not be given.

Referring to FIG. 12, the pixels P may be located around the transmitting area TA, and the first non-display area NDA1 may be located between the transmitting area TA and the display area DA. The display area DA includes the first display area DA1, the second display area DA2, and the third display area DA3 as described with reference to FIG. 3.

The pixels P may be located around the transmitting area TA to be spaced apart from one another. The pixels P may be located above and below the transmitting area TA and/or may be located at the left and the right of the transmitting area TA.

Signal lines adjacent to the transmitting area TA from among signal lines (e.g., SWL, SIL, EL, and DL) that apply a signal to the pixels P may bypass the transmitting area TA. A first bypass wiring WL1 passing through the first display area DA1 may extend in a first direction (corresponding to the y-direction of FIG. 12) to apply a signal to the pixels P located above and below the transmitting area TA with the transmitting area TA therebetween, and may bypass along an edge of the transmitting area TA in the second display area DA2. A second bypass wiring WL2 and a third bypass wiring WL3 passing through the first display area DA1 may extend in a second direction (corresponding to the x-direction of FIG. 12) to apply a signal to the pixels P located at the right and the left of the transmitting area TA with the transmitting area TA therebetween, and may bypass along an edge of the transmitting area TA in the second display area DA2. The first bypass wiring WL1, the second bypass wiring WL2, and the third bypass wiring WL3 may each correspond to one of the signal lines (e.g., SWL, SIL, EL, and DL).

An enlarged view of FIG. 12 illustrates a third area AR3 including parts of the first display area DA1, the second display area DA2, and the first non-display area NDA1. According to an embodiment of the present disclosure, the second light-emitting unit 200 that emits light due to the second pixel electrode 510 and the first light-emitting unit 300 that emits light due to the first pixel electrode 310 may be located in the first display area DA1, and the first dummy light-emitting unit 300' that emits light due to the first pixel electrode 310 may be located in the second display area DA2. For example, the pixel defining layer 119 covering an edge of the first pixel electrode 310 and including the first opening OP1 and the second opening OP2 through which a part of the first pixel electrode 310 is exposed may be provided, and one of the first opening OP1 or the second opening OP2 may be located in the second display area DA2. The third area AR3 will now be described in more detail with reference to FIG. 13.

Referring to FIG. 13, in some embodiments, the substrate 100 is located in the second display area DA2, and the buffer layer 110, the first gate insulating layer 111, the second gate insulating layer 113, the first interlayer insulating layer 115, the second interlayer insulating layer 116, and the planarization layer 117 are sequentially stacked on the substrate 100. The third bypass wiring WL3 is provided on the first gate insulating layer 111, the second bypass wiring WL2 is provided on (e.g., over) the second gate insulating layer 113, and the first bypass wiring WL1 is provided on (e.g., over) the interlayer insulating layer 115. The first bypass wiring WL1, the second bypass wiring WL2, and the third bypass wiring WL3 may each correspond to one of the signal lines (e.g., SWL, SIL, EL, and DL).

The first light-emitting unit 300 and the first dummy light-emitting unit 300' are located on the planarization layer 117. The first light-emitting unit 300 and the first dummy light-emitting unit 300' share the first pixel electrode 310, and the first intermediate layer 320 and the second intermediate layer 320' each including an organic emission layer are respectively located in the first opening OP1 and the second opening OP2 formed by the pixel defining layer 119. The opposite electrode 330 covering the first intermediate layer 320 and the second intermediate layer 320' is located on the pixel defining layer 119.

The first pixel electrode 310 may be connected to the first drain electrode D1 of the first TFT TFT1 through the contact hole 1163 formed in the planarization layer 117, and may be a (semi) light-transmitting electrode or a reflective electrode.

Although the first interlayer insulating layer 115, the second interlayer insulating layer 116, and the planarization layer 117 are provided, and the first pixel electrode 310 is connected to the first TFT TFT1 through the contact holes 1143, 1153, and 1163 respectively passing through the first interlayer insulating layer 115, the second interlayer insulating layer 116, and the planarization layer 117 in FIG. 13, the present disclosure is not limited thereto. In some embodiments, only the first interlayer insulating layer 115 from among the first interlayer insulating layer 115 and the second interlayer insulating layer 116 may be provided, and the first TFT TFT1 and the first pixel electrode 310 may be connected through the contact hole 1143 passing through the first interlayer insulating layer 115 and the contact hole 1163 passing through the planarization layer 117 as described with reference to FIG. 7B.

According to an embodiment of the present disclosure, because the second light-emitting unit 200 that emits light due to (e.g., due to being connected to and driven by) the second circuit unit PC2, the second circuit unit PC2 being provided in the first display area DA1, is located in the first display area DA1, the first opening OP1 and the second opening OP2 are defined by the pixel defining layer 119, and thus the first light-emitting unit 300 and the first dummy light-emitting unit 300' that emit light due to (e.g., due to being connected to and driven by) the first circuit unit PC1 are provided, the first light-emitting unit 300 being located in the first display area DA1 and the first dummy light-emitting unit 300' being located in the second display area DA2, damage to the pixel circuit PC due to static electricity present around the transmitting area TA may be prevented or reduced, and the display area DA may be extended from the first display area DA1 by (e.g., to) the second display area DA2.

Figure 14:
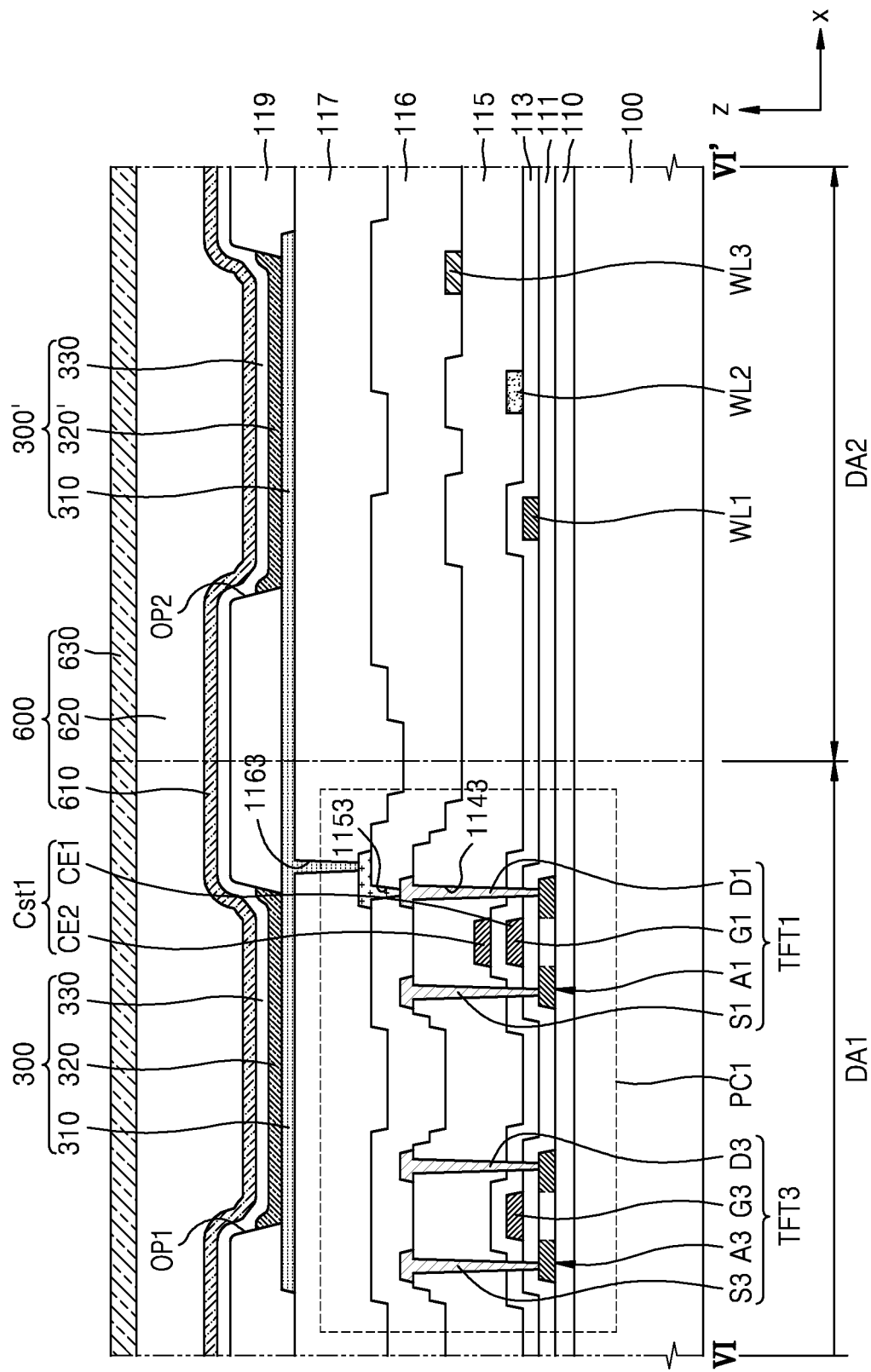
FIG. 14 is a cross-sectional view illustrating a part of a display apparatus according to an embodiment of the present disclosure.

FIG. 14 is a cross-sectional view illustrating a part of a display apparatus according to an embodiment of the present disclosure.

In more detail, FIG. 14 is a cross-sectional view illustrating a part of a display apparatus further including a thin-film encapsulation layer 600 on the first light-emitting unit 300 and the first dummy light-emitting unit 300' of FIG. 13.

Because the OLED (see FIG. 4A) may be easily damaged by external moisture, oxygen, etc., the OLED may be covered and protected by the thin-film encapsulation layer 600. The thin-film encapsulation layer 600 may cover the display area DA, and may extend to the outside of the display area DA. For example, the thin-film encapsulation layer 600 may extend to at least a portion of the non-display area NDA. The thin-film encapsulation layer 600 includes at least one organic encapsulation layer and at least one inorganic encapsulation layer. For example, the thin-film encapsulation layer 600 may include a first inorganic encapsulation layer 610, an organic encapsulation layer 620, and a second inorganic encapsulation layer 630.

The first inorganic encapsulation layer 610 may cover the opposite electrode 330, and may include (e.g., be) silicon oxide, silicon nitride, and/or silicon trioxynitride. In some embodiments, other layers such as a capping layer may be located between the first inorganic encapsulation layer 610 and the opposite electrode 330. Because the first inorganic encapsulation layer 610 is formed along a lower structure (e.g., a lower surface of the thin-film encapsulation layer 600), a top surface of the first inorganic encapsulation layer 610 is not flat. The organic encapsulation layer 620 may cover the first inorganic encapsulation layer 610, to have a substantially flat top surface, unlike the first inorganic encapsulation layer 610. In more detail, a top surface of a portion of the organic encapsulation layer 620 corresponding to the display area DA may be substantially flat. The organic encapsulation layer 620 may include (e.g., be) at least one material selected from the group consisting of polyethylene terephthalate, polyethylene naphthalate, polycarbonate, polyimide, polyethylene sulfonate, polyoxymethylene, polyarylate, and hexamethyldisiloxane. The second inorganic encapsulation layer 630 may cover the organic encapsulation layer 620, and may include (e.g., be) silicon oxide, silicon nitride, and/or silicon oxynitride.

Because the thin-film encapsulation layer 600 has the above multi-layer structure, even when cracks occur in the thin-film encapsulation layer 600, the cracks may not be connected between the first inorganic encapsulation layer 610 and the organic encapsulation layer 620 or between the organic encapsulation layer 620 and the second inorganic encapsulation layer 630. For example, when crack(s) occur in the thin-film encapsulation layer 600, the cracks may not continuously extend, individually or in combination, through the entire thickness of the thin-film encapsulation layer 600. Accordingly, the formation of a path through which external moisture and/or oxygen penetrates into the display area DA may be prevented, minimized, or reduced.

Also, in an embodiment, a sealing substrate facing the substrate 100 may be included. The substrate 100 and the sealing substrate may be adhered by utilizing a sealing member such as frit in the non-display area NDA (see FIG. 1).

Figure 15:
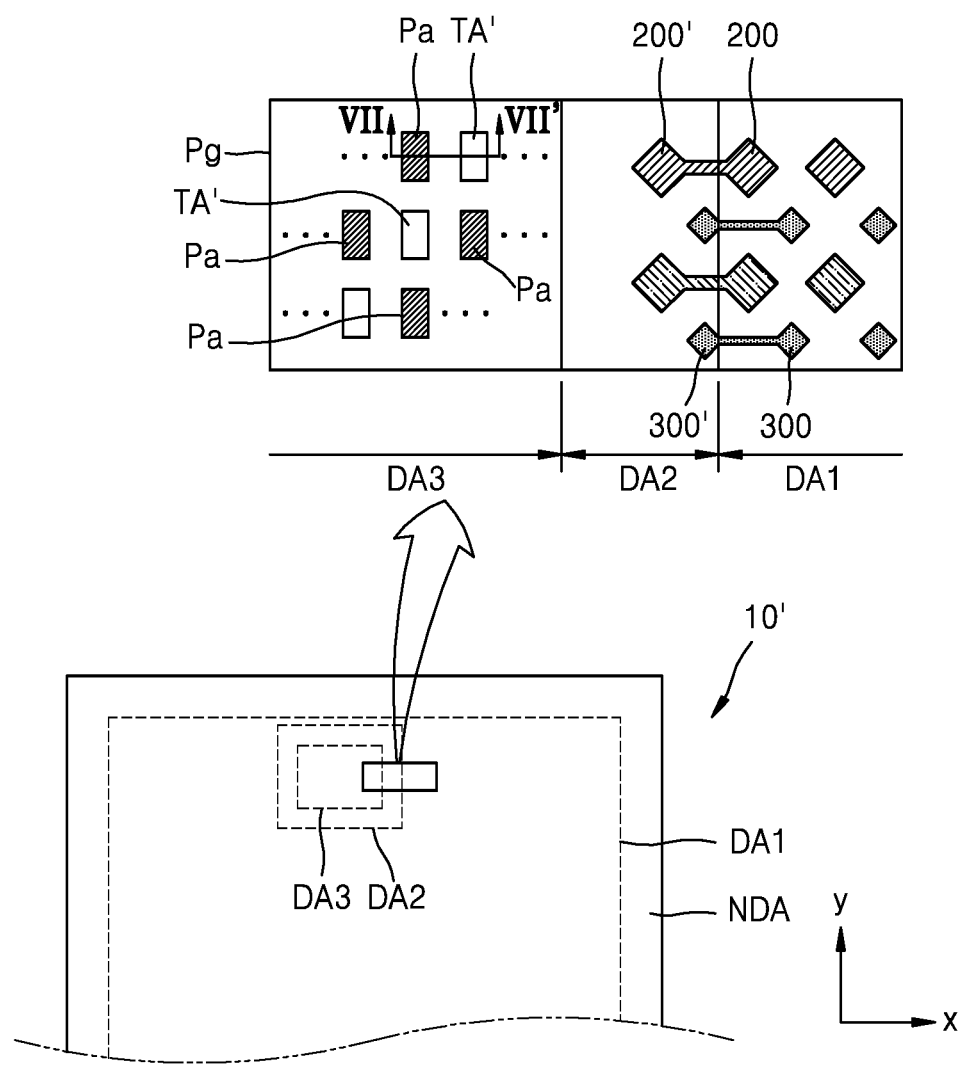
FIG. 15 is a plan view illustrating a part of a display apparatus according to an embodiment of the present disclosure.
Figure 16:
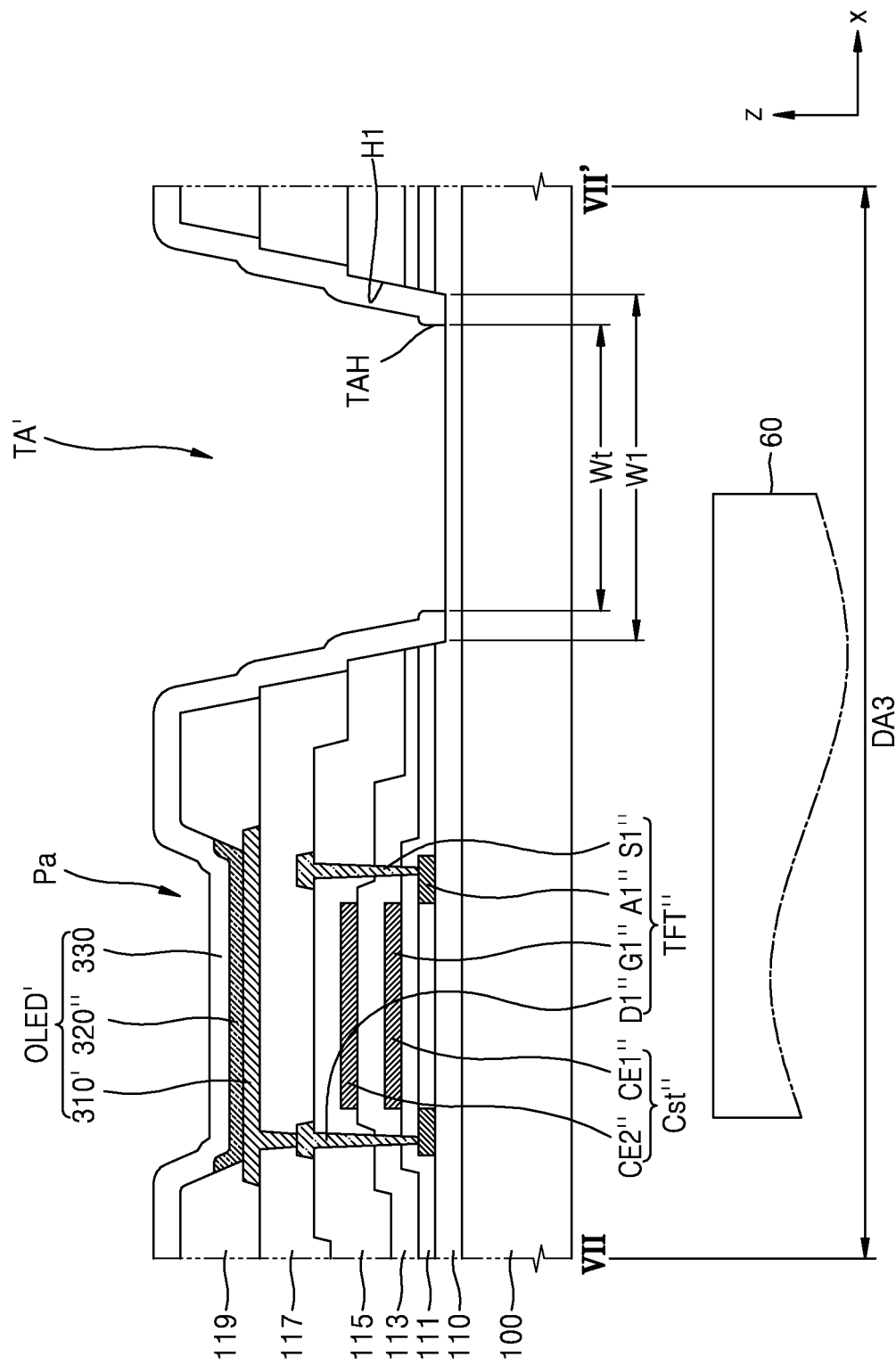
FIG. 16 is a cross-sectional view illustrating a part of a display apparatus according to an embodiment of the present disclosure.

FIG. 15 is a plan view illustrating a part of a display apparatus according to an embodiment of the present disclosure. FIG. 16 is a cross-sectional view illustrating a part of a display apparatus according to an embodiment of the present disclosure, taken along line VII-VII' of FIG. 15.

Referring to FIG. 15, a display panel 10' includes the display area DA and the non-display area NDA. The display area DA includes the first display area DA1, the second display area DA2, and the third display area DA3. The second display area DA2 surrounds the third display area DA3, and the first display area DA1 entirely surrounds the second display area DA2.

A component 60 may be located under the third display area DA3. For example, in some embodiments, the component 60 may be located in the third display area DA3 under the substrate 100. For example, the component 60 may be an electronic element utilizing light and/or sound. Examples of the component 60 may include a sensor for receiving and utilizing light such as an infrared sensor, a sensor for outputting and detecting light and/or sound to measure a distance or recognize a fingerprint, a small lamp for outputting light, a speaker for outputting sound, and a camera. When the component 60 is an electronic element utilizing light, the component 60 may use light of various suitable wavelength bands such as visible light, infrared light, or ultraviolet light. A plurality of components 60 may be located in the third display area DA3. For example, a light-emitting device and a light-receiving device may be provided together as the component 60 in one third display area DA3. In some embodiments, a light-emitting unit and a light-receiving unit may both be provided (e.g., may be simultaneously provided) in one component 60.

Referring to an enlarged view of a portion of FIG. 15, a plurality of auxiliary pixels Pa may be located in the third display area DA3. Also, a plurality of transmitting units TA' where a display element is not located may be located in the third display area DA3. The transmitting unit TA' may be an area through which light (or a signal) emitted from the component 60, or light (or a signal) incident on the component 60, is transmitted.

Auxiliary pixels Pa may be continuously arranged to form one pixel group Pg. At least one auxiliary pixel Pa may be included in the pixel group Pg.

In the present embodiment, the first dummy light-emitting unit 300' may be driven by the first circuit unit PC1 (see FIG. 6) but may overlap the first dummy circuit unit DPC1 (see FIG. 6). For example, as shown in FIG. 6, one light-emitting unit may be moved to the second display area DA2. Also, as shown in FIG. 8, two light-emitting units may be moved to the second display area DA2, or more light-emitting units may be moved.

In the present embodiment, the first light-emitting unit 300 that is driven by the first circuit unit PC1 and overlaps the first circuit unit PC1 may be further provided. For example, as shown in FIG. 9, a light-emitting unit may be extended, rather than moved, to the second display area DA2. Also, as shown in FIG. 11, two light-emitting units may be extended to the second display area DA2, or more light-emitting units may be extended.

Referring to FIG. 16, a display apparatus according to an embodiment of the present disclosure includes the third display area DA3. The auxiliary pixel Pa and the transmitting unit TA' are located in the third display area DA3.

The auxiliary pixel Pa may include an auxiliary TFT", an auxiliary storage capacitor Cst", and an auxiliary OLED'. The transmitting unit TA' may include an opening portion TAH to correspond to the transmitting unit TA'.

Because the transmitting unit TA' is located in the third display area DA3, light transmitted to, or received from, the component 60 may be transmitted. For example, light emitted from the component 60 may travel in a z-direction through the transmitting unit TA', and light generated outside the display apparatus and incident on the component 60 may travel in a –z-direction through the transmitting unit TA'. In some embodiments, the component 60 may include a plurality of image sensors, and one image sensor may be located to correspond to one transmitting unit TA'.

In the present embodiment, the opposite electrode 330 may include the opening portion TAH corresponding to the transmitting unit TA'. In some embodiments, widths of openings for forming the opening portion TAH may be substantially the same. For example, a width of an opening of the opposite electrode 330 may be substantially the same as a width of the opening portion TAH.

When the opening portion TAH corresponds to the transmitting unit TA', it may mean that the opening portion TAH overlaps the transmitting unit TA'. In this case, the area (e.g., the area when viewed from a plane) of the opening portion TAH may be less than the area of a first hole H1 formed in the second gate insulating layer 113. In some embodiments, the first hole H1 may be a hole formed in the first gate insulating layer 111, the second gate insulating layer 113, and the first interlayer insulating layer 115. To this end, in FIG. 16, a width Wt of the opening portion TAH is less than a width W1 of the first hole H1. The area of the opening portion TAH and the area of the first hole H1 may be defined as the area of a narrowest opening.

When the opening portion TAH is formed, it means that a member such as the opposite electrode 330 is removed from the transmitting unit TA', and thus a light transmittance of the transmitting unit TA' may be significantly increased.

Because the first dummy light-emitting unit 300' that is driven by the first circuit unit PC1 and that overlaps the first dummy circuit unit DPC1 is provided according to an embodiment of the present disclosure, damage to the pixel circuit PC due to static electricity present around the transmitting area TA may be prevented or reduced, and the display area DA may be extended from the first display area DA1 by (e.g., to) the second display area DA2.

Also, because the first light-emitting unit 300 that is driven by the first circuit unit PC1 and that overlaps the first circuit unit PC1 is further provided in another embodiment of the present disclosure, a luminance may be increased.

Although a display apparatus has been described, the present disclosure is not limited thereto. For example, a method of manufacturing a display apparatus may also be within the scope of the present disclosure.

According to an embodiment of the present disclosure, a display apparatus in which a light-emitting unit is moved and/or extended may be provided. However, the scope of the present disclosure is not limited by the disclosed aspects and features.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various suitable changes in form and details may be made therein without departing from the spirit and scope of the present disclosure as defined by the following claims and equivalents thereof.

What is claimed is:

1. A display apparatus comprising:
   a substrate;
   a first circuit unit located on the substrate and comprising a first thin-film transistor (TFT) and a first storage capacitor;
   a first dummy circuit unit on the substrate, comprising a first dummy TFT and a first dummy storage capacitor, and in the same layer as the first circuit unit; and
   a first dummy light-emitting unit on the first dummy circuit unit, connected to the first circuit unit, and configured to be driven by the first circuit unit,
   wherein the first dummy light-emitting unit overlaps the first dummy circuit unit in a plan view.

2. The display apparatus of claim 1, further comprising a first light-emitting unit on the first circuit unit, connected to the first circuit unit, and configured to be driven by the first circuit unit,
   wherein the first light-emitting unit overlaps the first circuit unit.

3. The display apparatus of claim 1, further comprising:
   a second circuit unit located on the substrate and comprising a second TFT and a second storage capacitor;
   a second dummy circuit unit on the substrate, comprising a second dummy TFT and a second dummy storage capacitor, and in the same layer as the second circuit unit; and
   a second dummy light-emitting unit on the second dummy circuit unit, connected to the second circuit unit, and configured to be driven by the second circuit unit, wherein the second dummy light-emitting unit overlaps the second dummy circuit unit.

4. The display apparatus of claim 3, further comprising a second light-emitting unit on the second circuit unit, connected to the second circuit unit, and configured to be driven by the second circuit unit,
wherein the second light-emitting unit overlaps the second circuit unit.

5. The display apparatus of claim 1, wherein the substrate comprises a transmitting area, a first display area surrounding the transmitting area, a second display area between the transmitting area and the first display area, and a first non-display area between the transmitting area and the second display area,
wherein the first circuit unit is in the first display area, and
wherein the first dummy circuit unit is in the second display area.

6. The display apparatus of claim 1, wherein the substrate comprises a third display area, a first display area surrounding the third display area, and a second display area between the first display area and the third display area,
wherein a transmitting unit is in the third display area,
wherein the first circuit unit is in the first display area, and
wherein the first dummy circuit unit is in the second display area.

7. The display apparatus of claim 6, further comprising a component located under the third display area.

8. A display apparatus comprising:
a substrate;
a first circuit unit on the substrate and comprising a first thin-film transistor (TFT) and a first storage capacitor;
a first pixel electrode on the first circuit unit and connected to the first TFT;
a pixel defining layer covering an edge of the first pixel electrode and having a first opening and a second opening, a first part of the first pixel electrode being exposed through the first opening and a second part of the first pixel electrode being exposed through the second opening;
a first intermediate layer in the first opening;
a second intermediate layer in the second opening; and
an opposite electrode on the pixel defining layer and covering the first intermediate layer and the second intermediate layer.

9. The display apparatus of claim 8, wherein the first opening overlaps the first circuit unit.

10. The display apparatus of claim 8, further comprising:
a second circuit unit on the substrate, in the same layer as the first circuit unit, and comprising a second TFT and a second storage capacitor;
a second pixel electrode on the second circuit unit, in the same layer as the first pixel electrode, and connected to the second TFT;
a third intermediate layer on the second pixel electrode; and
a fourth intermediate layer in the same layer as the third intermediate layer,
wherein the pixel defining layer covers an edge of the second pixel electrode and further has a third opening and a fourth opening through which a part of the second pixel electrode is exposed,
wherein the third intermediate layer is in the third opening, and
wherein the fourth intermediate layer is in the fourth opening.

11. The display apparatus of claim 10, wherein the third opening overlaps the second circuit unit.

12. The display apparatus of claim 8, wherein the substrate comprises a transmitting area, a first display area surrounding the transmitting area, a second display area between the transmitting area and the first display area, and a first non-display area between the transmitting area and the second display area,
wherein the first circuit unit is in the first display area, and
wherein one of the first opening or the second opening is in the second display area.

13. The display apparatus of claim 8, wherein the substrate comprises a third display area, a first display area surrounding the third display area, and a second display area between the first display area and the third display area,
wherein a transmitting unit is in the third display area,
wherein the first circuit unit is in the first display area, and
wherein one of the first opening or the second opening is in the second display area.

14. The display apparatus of claim 13, further comprising a component located under the third display area.

15. A display apparatus comprising:
a substrate comprising a transmitting area, a first display area surrounding the transmitting area, a second display area between the transmitting area and the first display area, and a first non-display area between the transmitting area and the second display area;
a first bypass wiring in the second display area, extending in a first direction, and bypassing the transmitting area along an edge of the transmitting area;
a first circuit unit in the first display area and comprising a first thin-film transistor (TFT) and a first storage capacitor;
a first pixel electrode on the first circuit unit and connected to the first TFT;
a pixel defining layer covering an edge of the first pixel electrode and having a first opening and a second opening through which a part of the first pixel electrode is exposed;
a first intermediate layer in the first opening;
a second intermediate layer in the second opening; and
an opposite electrode on the pixel defining layer and covering the first intermediate layer and the second intermediate layer,
wherein one of the first opening or the second opening overlaps the first bypass wiring.

16. The display apparatus of claim 15, further comprising:
a second circuit unit in the first display area, in the same layer as the first circuit unit, and comprising a second TFT and a second storage capacitor;
a second pixel electrode on the second circuit unit, in the same layer as the first pixel electrode, and connected to the second TFT;
a third intermediate layer on the second pixel electrode; and
a fourth intermediate layer in the same layer as the third intermediate layer,
wherein the pixel defining layer covers an edge of the second pixel electrode and further has a third opening and a fourth opening through which a part of the second pixel electrode is exposed,
wherein the third intermediate layer is in the third opening,
the fourth intermediate layer is in the fourth opening, and
one of the third opening or the fourth opening overlaps the first bypass wiring.

17. The display apparatus of claim 15,
wherein the first non-display area is a third display area, and wherein a transmitting unit is in the third display area.

18. The display apparatus of claim 17, further comprising a component under the third display area.

19. The display apparatus of claim 15, further comprising a thin-film encapsulation layer on the substrate and facing the substrate.

20. The display apparatus of claim 15,
wherein the first storage capacitor comprises an upper electrode and a lower electrode, and
wherein the lower electrode overlaps the first TFT.

21. A display apparatus comprising:
a substrate including a first area and a second area, wherein a transmitting unit is in the first area, and the second area surrounds the first area;
a circuit unit disposed on the second area and comprising a thin-film transistor (TFT) and a storage capacitor;
a pixel electrode disposed on the first area and connected to the TFT;
a pixel defining layer having a first opening, wherein the first opening exposes at least a portion of the pixel electrode;
a intermediate layer in the first opening; and
an opposite electrode disposed on the pixel defining layer and covering the intermediate layer.

22. The display apparatus of claim 21, further comprising a component located under the first area.

* * * * *